United States Patent
Lee et al.

(10) Patent No.: US 11,973,072 B2
(45) Date of Patent: Apr. 30, 2024

(54) DISPLAY DEVICE INCLUDING FIRST AND SECOND LIGHT BLOCKING PATTERNS

(71) Applicant: Samsung Display Co., LTD., Yongin-si (KR)

(72) Inventors: Eung Gyu Lee, Yongin-si (KR); Jin Suek Kim, Yongin-si (KR); Sae Ron Park, Yongin-si (KR); Seung Bo Shim, Yongin-si (KR); Ho Kil Oh, Yongin-si (KR); Jae Soo Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 209 days.

(21) Appl. No.: 17/357,800

(22) Filed: Jun. 24, 2021

(65) Prior Publication Data

US 2022/0084999 A1 Mar. 17, 2022

(30) Foreign Application Priority Data

Sep. 16, 2020 (KR) .................. 10-2020-0119401

(51) Int. Cl.
*H01L 25/16* (2023.01)
*H01L 33/50* (2010.01)

(52) U.S. Cl.
CPC .......... *H01L 25/167* (2013.01); *H01L 33/507* (2013.01); *H01L 2933/0091* (2013.01)

(58) Field of Classification Search
CPC ............... H01L 25/167; H01L 33/507; H01L 2933/0091
See application file for complete search history.

(56) References Cited

U.S. PATENT DOCUMENTS

| | | | |
|---|---|---|---|
| 6,407,360 B1 | 6/2002 | Choo et al. | |
| 9,442,320 B2 | 9/2016 | Jeon et al. | |
| 2018/0006272 A1* | 1/2018 | Lee | H10K 59/126 |
| 2018/0088404 A1* | 3/2018 | Chae | H10K 59/38 |
| 2019/0181188 A1* | 6/2019 | Youn | H10K 50/852 |
| 2019/0259816 A1* | 8/2019 | Kim | H10K 50/865 |
| 2019/0348470 A1* | 11/2019 | Song | H10K 50/86 |
| 2021/0072579 A1 | 3/2021 | Kim et al. | |
| 2021/0111162 A1* | 4/2021 | Takeya | H01L 33/38 |
| 2021/0280662 A1 | 9/2021 | Kim et al. | |
| 2021/0319727 A1 | 10/2021 | Kim | |

FOREIGN PATENT DOCUMENTS

| | | |
|---|---|---|
| CN | 105652506 | 6/2016 |
| JP | 4729754 | 7/2011 |
| JP | 4934920 | 5/2012 |

(Continued)

*Primary Examiner* — Tracie Y Green
(74) *Attorney, Agent, or Firm* — Lewis Roca Rothgerber Christie LLP

(57) ABSTRACT

A display device includes: a base layer including a display area including an emission area and a non-emission area adjacent to the emission area, and a non-display area around the display area; a light emitting element in the emission area on the base layer; a color filter layer located above the light emitting element; and a light blocking pattern on the light emitting element and including a first light blocking pattern in the non-emission area and a second light blocking pattern in the non-display area. The first light blocking pattern and the second light blocking pattern are different in thickness from each other.

8 Claims, 13 Drawing Sheets

(56) References Cited

FOREIGN PATENT DOCUMENTS

| KR | 10-0539971 | | | 4/2006 |
|---|---|---|---|---|
| KR | 10-2015-0080721 | | | 7/2015 |
| KR | 20190072822 | A | * | 6/2019 |
| KR | 20200122460 | A | * | 10/2020 |
| KR | 10-2021-0031565 | | | 3/2021 |
| KR | 10-2021-0113478 | A | | 9/2021 |
| KR | 10-2021-0127272 | | | 10/2021 |

* cited by examiner

| CLASSIFICATION | BLUE+RED STACK | |
|---|---|---|
| Red | 2.4 | 2.6 |
| Blue | 1.4 | 2.8 |
| STACKED THICKNESS | 3.8 | 5.4 |
| OD VALUE @550nm | 2.2 | 3.6 |

DISPLAY DEVICE INCLUDING FIRST AND SECOND LIGHT BLOCKING PATTERNS

CROSS-REFERENCE TO RELATED APPLICATION

This application claims priority to and the benefit of Korean patent application 10-2020-0119401, filed on Sep. 16, 2020, the entire disclosure of which is hereby incorporated by reference.

BACKGROUND

1. Field

The present disclosure generally relates to a display device.

2. Description of the Related Art

As interest in information displays and demand for portable information media increase, research and commercialization has focused on display devices.

SUMMARY

Aspects of embodiments of the present disclosure are directed towards a display device capable of increasing light transmittance in a non-display area.

In accordance with an embodiment of the present disclosure, there is provided a display device including: a base layer including a display area including an emission area and a non-emission area adjacent to the emission area, and a non-display area around (e.g., surrounding) the display area; a light emitting element in the emission area on the base layer; a color filter layer on the light emitting element; and a light blocking pattern on the light emitting element and including a first light blocking pattern in the non-emission area and a second light blocking pattern in the non-display area, wherein the first light blocking pattern and the second light blocking pattern are different in thickness from each other.

The second light blocking pattern may be thinner than first light blocking pattern in thickness.

The second light blocking pattern may be 1 µm or less in thickness.

The first light blocking pattern and the second light blocking pattern may be in the same layer.

The emission area may include a first sub-emission area, a second sub-emission area, and a third sub-emission area, which are spaced apart from each other. The color filter layer may include a first color filter, a second color filter, and a third color filter, which are respectively in the first sub-emission area, the second sub-emission area, and the third sub-emission area.

The first light blocking pattern may be between two color filters selected from among the first color filter, the second color filter, and the third color filter, or may overlap with an edge of at least one selected from among the first color filter, the second color filter, and the third color filter.

The second light blocking pattern may be at a side surface of at least one color filter selected from among the first color filter adjacent to the non-display area, the second color filter, and the third color filter, or may overlap with at least a portion of the first light blocking pattern adjacent to the non-display area.

The display device may further include a color conversion layer on one surface of the color filter layer. The color conversion layer may include: a light scattering layer on one surface of the first color filter, and including light scattering particles; a first color conversion layer on one surface of the second color filter, and including first color conversion particles; and a second color conversion layer on one surface of the third color filter, and including second color conversion particles.

The display device may further include an encapsulation layer on the color filter layer. The color filter layer may be on the color conversion layer. The encapsulation layer may cover surfaces of the first color filter, the second color filter, the third color filter, the first light blocking pattern, and the second light blocking pattern.

In accordance with an embodiment of the present disclosure, there is provided a display device including: a base layer including a display area including an emission area and a non-emission area adjacent to the emission area, and a non-display area around (e.g., surrounding) the display area; a light emitting element in the emission area, and on the base layer; and a color filter layer in the display area and the non-display area, and on the light emitting element, wherein the color filter layer includes: a main color filter in the emission area, the non-emission area, and the non-display area; an overlapping color filter overlapping with a portion of the main color filter, and being in the non-emission area; and an auxiliary color filter overlapping with a portion of the main color filter, and being in the non-display area, and wherein the overlapping color filter and the auxiliary color filter are different in thickness from each other.

The auxiliary color filter may be thinner than the overlapping color filter in thickness.

The main color filter may include a first color filter, a second color filter, and a third color filter, which respectively may allow light of a first color, a second color, and a third color to be transmitted therethrough.

Each of the first color, the second color, and the third color may be one selected from among red, green, and blue.

The first color filter, the second color filter, and the third color filter may be in the same layer.

The overlapping color filter may include a first overlapping color filter and a second overlapping color filter, which each may allow light of different colors to be transmitted therethrough. The first overlapping color filter and the second overlapping color filter may be on one surface of the main color filter to overlap with each other.

The first overlapping color filter may allow light of one color selected from among the first color, the second color, and the third color to be transmitted therethrough, the second overlapping color filter may allow light of another color selected from among the first color, the second color, and the third color to be transmitted therethrough, and the main color filter may allow light of the remaining color selected from among the first color, the second color, and the third color to be transmitted therethrough.

The main color filter may allow light of the first color to be transmitted therethrough, and the auxiliary color filter may allow light of the second color or the third color to be transmitted therethrough.

In the non-emission area, the main color filter, the first overlapping color filter, and the second overlapping color filter may be to block light emitted from the light emitting element from being transmitted therethrough.

The display device may further include a color conversion layer on one surface of the color filter layer. The color conversion layer may include: a light scattering layer on one surface of the first color filter, and including light scattering particles; a first color conversion layer on one surface of the second color filter, and including first color conversion particles; and a second color conversion layer on one surface of the third color filter, and including second color conversion particles.

The display device may further include an encapsulation layer located on the color filter layer. The color filter layer may be located on the color conversion layer. The encapsulation layer may cover surfaces of the main color filter, the overlapping color filter, and the auxiliary color filter.

BRIEF DESCRIPTION OF THE DRAWINGS

Example embodiments will now be described more fully hereinafter with reference to the accompanying drawings; however, the present disclosure may be embodied in different suitable forms and should not be construed as limited to the embodiments set forth herein. Rather, these embodiments are provided so that this disclosure will be thorough and complete, and will fully convey the scope of the present disclosure to those of ordinary skill in the art.

In the drawings, dimensions may be exaggerated for clarity of illustration and description. It will be understood that when an element is referred to as being "between" two elements, it can be the only element between the two elements (e.g., it may be directly between the two elements), or one or more intervening elements may also be present between the two elements. Like reference numerals refer to like elements throughout.

DETAILED DESCRIPTION

Figure 1:
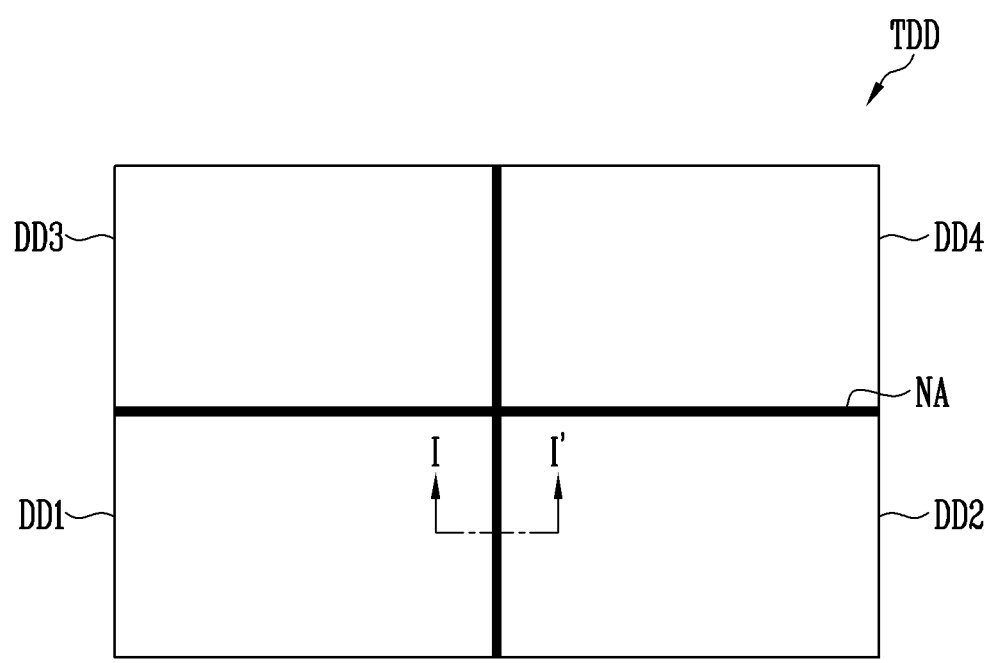
FIG. 1 is a plan view illustrating a display device in accordance with an embodiment.
Figure 1:
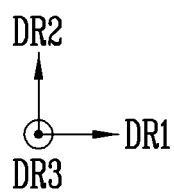

The present disclosure may apply various suitable changes and different suitable shapes, and therefore, the present disclosure only illustrates and describes details of some examples. However, the examples do not limit the present disclosure to certain shapes, and the present disclosure includes all suitable changes, equivalent materials, and replacements. The drawings included are illustrated in a fashion where the figures may be expanded for better understanding and ease of description.

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that terms such as "includes" and "including", when used in this specification, specify the presence of stated features, integers, steps, tasks, operations, elements, and/or components, but do not preclude the presence and/or addition of one or more other features, integers, steps, tasks, operations, elements, components, and/or groups thereof. Further, an expression that an element such as a layer, region, substrate or plate is placed "on" or "above" another element indicates not only a case where the element is placed directly on or just above the other element, but also cases where one or more additional elements are interposed between the element and the other element. Moreover, an expression that an element such as a layer, region, substrate or plate is placed "beneath" or "below" another element indicates not only a case where the element is placed directly beneath or just below the other element but also cases where one or more additional elements is interposed between the element and the other element.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, a display device in accordance with an embodiment of the present disclosure will be described with reference to the accompanying drawings.

Figure 2:
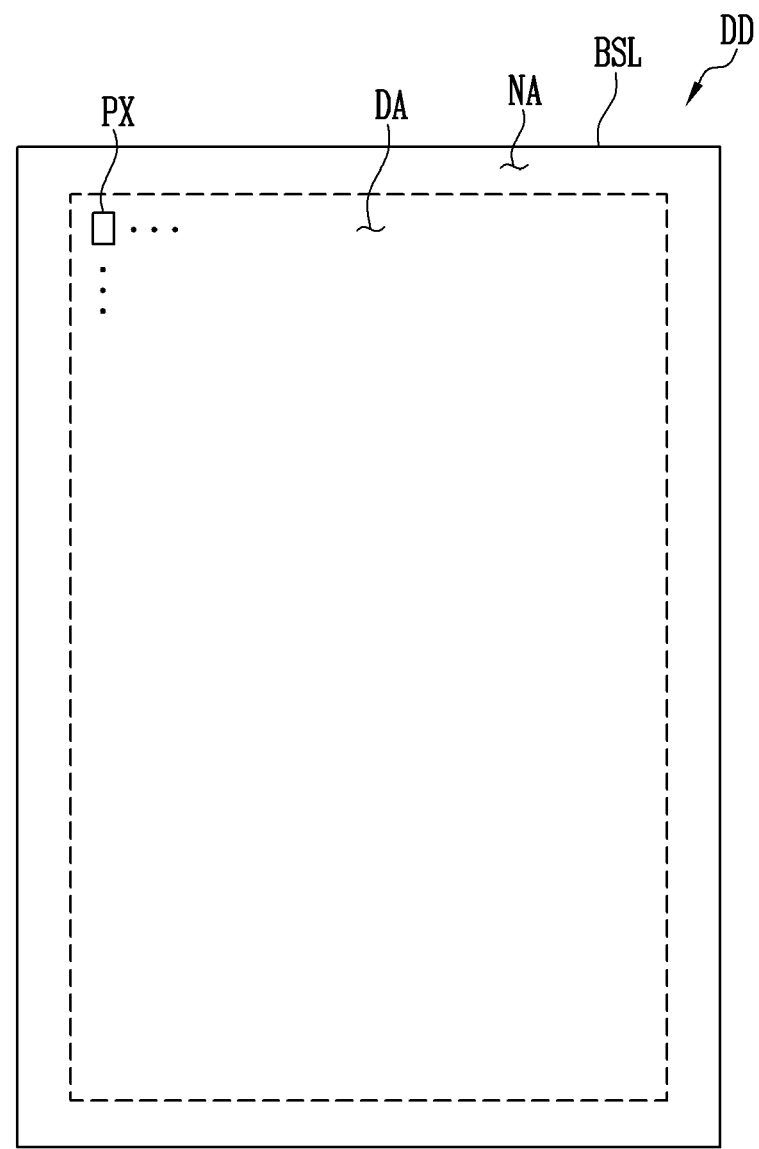
FIG. 2 is a schematic plan view of a display device in accordance with an embodiment.

FIG. 1 is a plan view illustrating a display device in accordance with an embodiment. FIG. 2 is a schematic plan view of a display device in accordance with an embodiment.

Referring to FIG. 1, the display device in accordance with the embodiment may be a multi-screen display device including a plurality of display devices.

The multi-screen display device TDD (referred to as a "tiled display") may include a plurality of display devices DD1, DD2, DD3, and DD4 arranged in a matrix form along a first direction DR1 and a second direction DR2.

The plurality of display devices DD1, DD2, DD3, and DD4 may display individual images or display one image divided into pieces. For example, the plurality of display devices DD1, DD2, DD3, and DD4 may each display independent images or may collectively display a single image. The plurality of display devices DD1, DD2, DD3, and DD4 may include display panels having the same kind, having the same structure, having the same size, and/or being the same type, but the present disclosure is not limited thereto. The plurality of display devices DD1, DD2, DD3, and DD4 may be physically coupled to each other by a housing which can be located on the bottom of the plurality of display devices DD1, DD2, DD3, and DD4, to constitute one multi-screen display device TDD.

The plurality of display devices DD1, DD2, DD3, and DD4 may be implemented in (e.g., may have) various suitable shapes. Although a case where the plurality of display devices DD1, DD2, DD3, and DD4 have a rectangular plate shape is illustrated in FIG. 1, the present disclosure is not limited thereto. For example, each of the plurality of display devices DD1, DD2, DD3, and DD4 may have a shape such as a circular shape or an elliptical shape.

Referring to FIG. 2, one display device DD among the plurality of display devices DD1, DD2, DD3, and DD4 will be described.

The display device DD includes a display area DA and a non-display area NA. The display area DA includes a plurality of pixels PX, and is an area in which an image is to be displayed. The non-display area NA is an area except the display area DA, and is an area in which the image is not displayed. The non-display area NA may be a bezel area around (e.g., surrounding) the display area DA.

The display area DA may be located on one surface of the display device DD. In an example, the display area DA may be located on a front surface of the display device DD. In addition, the display area DA may be additionally located on a side surface and/or on a rear surface of the display device DD.

The non-display area NA may be located at the periphery of the display area DA to be around (e.g., to surround) the display area DA. The non-display area NA may selectively include lines, pads, a driving circuit, and the like, which are coupled (e.g., connected) to the pixels PX of the display area DA.

In some embodiments, a sealing part for bonding an upper substrate and a lower substrate, which will be described later, may be located between the display area DA and the non-display area NA. In some embodiments, the sealing part may be in the non-display area NA. The sealing part may be disposed along an edge of a base layer BSL, to be around (e.g., to surround) the display area DA on a plane.

In the plurality of display devices DD1, DD2, DD3, and DD4, an image displayed on a screen of the multi-screen display device TDD may be cut off due to a non-display area NA located in a boundary area between the plurality of display devices DD1, DD2, DD3, and DD4. For example, when the width (or area) of the non-display area NA is relatively large, the cutoff of the image in the boundary area between the plurality of display devices DD1, DD2, DD3, and DD4 may be deepened (e.g., may be widened or may become more visible). The non-display area NA located in the boundary area between the plurality of display devices DD1, DD2, DD3, and DD4 may be designated as a seam area, an assembly joint area, or a dead space area.

In addition, the boundary area between the plurality of display devices DD1, DD2, DD3, and DD4 is viewed (e.g., is visible), and therefore, the luminance of an image displayed on the screen of the multi-screen display device TDD may be lowered. The structure in accordance with an embodiment of the present disclosure, which can increase light transmittance in the seam area such that the boundary area between the plurality of display devices DD1, DD2, DD3, and DD4 is less visible (e.g., is not viewed or is not visible), will be described in more detail below.

The pixels PX may be provided in the display area DA of the base layer BSL. Each of the pixels PX may be a unit (e.g., a minimum unit) for displaying an image. Each of the pixels PX may include a light emitting element (LD shown in the following drawings, for example, in FIG. 3) which is to emit white light and/or colored light. Each of the pixels PX may emit light of at least one color among red, green, and blue. However, the present disclosure is not limited thereto. For example, each of the pixels PX may emit light of a color such as cyan, magenta or yellow. Although a case where the pixel PX has a rectangular shape is illustrated in the drawing, the present disclosure is not limited thereto, and the shape of the pixel PX may be variously and suitably modified. Each of the pixels PX may include a pixel circuit layer PCL provided on the base layer BSL which will be described later and a display element layer DPL provided on the pixel circuit layer PCL.

For convenience of description, only one pixel PX is illustrated in FIG. 2, but a plurality of pixels PX may be substantially distributed and arranged in the display area DA. In an example, the plurality of pixels PX may be arranged in a matrix, stripe or PENTILE® (Registered trademark of Samsung Display Company, Ltd.) arrangement structure in the display area DA. In some embodiments, the plurality of pixels PX may be arranged in an RGBG matrix. However, the present disclosure is not limited thereto.

Hereinafter, a configuration of a display device in accordance with an embodiment will be described with reference to FIGS. 3-7.

Figure 3:
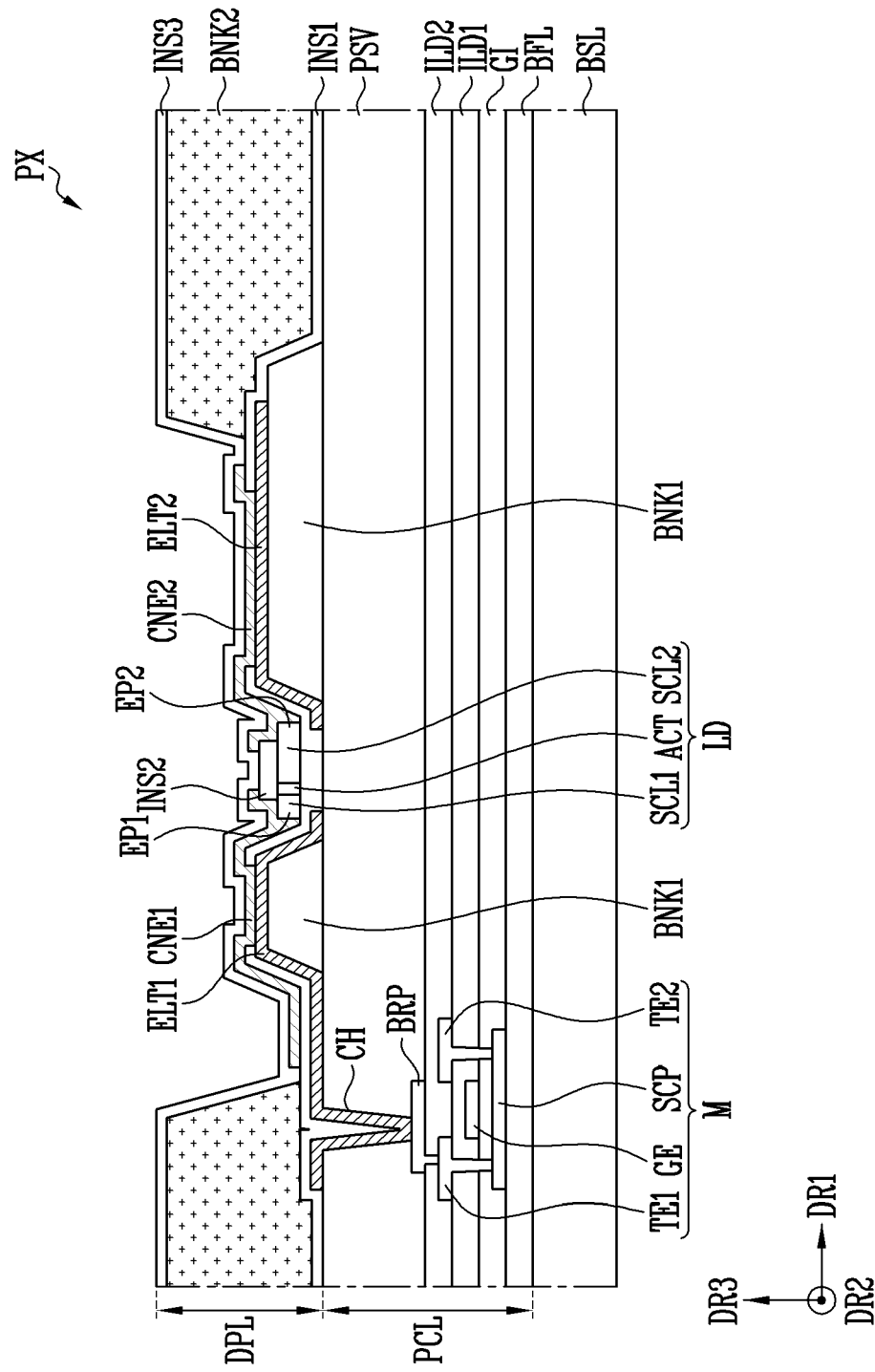
FIG. 3 is a cross sectional view illustrating a pixel circuit layer and a display element layer of a display device in accordance with an embodiment.

FIG. 3 is a cross sectional view illustrating a pixel circuit layer and a display element layer of a display device in accordance with an embodiment. FIGS. 4-7 are each a cross sectional view of a display device in accordance with an embodiment. FIG. 3 schematically illustrates a cross sectional view of one pixel PX shown in FIG. 2, and FIGS. 4-7 may correspond to a section taken along line I-I' shown in FIG. 1.

First, referring to FIG. 3, the pixel PX and the display device in accordance with the embodiment may include a base layer BSL, and a pixel circuit layer PCL and a display element layer DPL, which are located on one surface of the base layer BSL. For example, a display area DA may include the pixel circuit layer PCL disposed on the one surface of the base layer BSL and the display element layer DPL disposed on the pixel circuit layer PCL. However, in some embodiments, the mutual position between the pixel circuit layer PCL and the display element layer DPL on the base layer BSL may be suitably changed.

The pixel circuit layer PCL may include at least one transistor, a storage capacitor, and a plurality of lines coupled (e.g., connected) thereto.

Also, the pixel circuit layer PCL may include a buffer layer BFL, a gate insulating layer GI, a first interlayer insulating layer ILD1, a second interlayer insulating layer ILD2, and/or a passivation layer PSV, which are sequentially stacked on the one surface of the base layer BSL.

The buffer layer BFL, which may be located on the entire surface of the base layer BSL, may include an inorganic insulating material. The buffer layer BFL may prevent or block an impurity from being diffused into a transistor, a capacitor, etc.

A semiconductor layer is located on the buffer layer BFL. The semiconductor layer includes a first semiconductor pattern SCP of a transistor M. The first semiconductor pattern SCP may include a channel region overlapping with a first gate electrode GE, which will be described later, and a source region and a drain region, which are disposed at two sides (e.g., both sides) of the channel region. For example, the source region and the drain region may be at opposite sides of the channel region. The first semiconductor pattern SCP may be made of polycrystalline silicon, amorphous silicon, oxide semiconductor, and/or the like.

The gate insulating layer GI is located on the semiconductor layer. The gate insulating layer GI may include (e.g., be) an inorganic material including (e.g., being) silicon oxide SiOx ($SiO_x$), silicon nitride SiNx ($SiN_x$), and/or silicon oxynitride SiOxNy ($SiO_xN_y$), etc. However, the present disclosure is not limited thereto. In some embodiments, the gate insulating layer GI may be an organic insulating layer including (e.g., being) an organic material.

A gate conductor is located on the gate insulating layer. The gate conductor includes the first gate electrode GE. The first gate electrode GE may be located to overlap with the channel region of the first semiconductor pattern SCP. The gate conductor may include a gate electrode of each of a plurality of transistors included in the pixel circuit layer PCL. In some embodiments, the gate conductor may include one electrode of the storage capacitor, a gate line, and/or the like.

The first interlayer insulating layer ILD1 is located over the gate conductor. The first interlayer insulating layer ILD1 may include (e.g., be) the same material as the gate insulating layer GI, or may include (e.g., be) at least one selected from among the materials that may be included in the gate insulating layer GI. In an example, the first interlayer insulating layer ILD1 may be an inorganic insulating layer including (e.g., being) an inorganic material.

A first data conductor is located on the first interlayer insulating layer ILD1. The first data conductor includes a first electrode TE1 and a second electrode TE2. The first electrode TE1 may be a drain electrode coupled (e.g., connected) to the drain region of the first semiconductor pattern SCP, and the second electrode TE2 may be a source electrode coupled (e.g., connected) to the source region of the first semiconductor pattern SCP. In some embodiments, the first electrode TE1 may be a source electrode of the transistor M, and the second electrode TE2 may be a drain electrode of the transistor Ml. The first data conductor may include the first electrode TE1 and the second electrode TE2 of each of the plurality of transistors. In some embodiments, the first data conductor may include the other electrode of the storage capacitor, a data line, and/or the like.

The second interlayer insulating layer ILD2 is located on the first data conductor. The second interlayer insulating layer ILD2 may include (e.g., be) an inorganic material including (e.g., being) silicon oxide SiOx ($SiO_x$), silicon nitride SiNx ($SiN_x$), and/or silicon oxynitride SiOxNy ($SiO_xN_y$), etc. In some embodiments, the second interlayer insulating layer ILD2 may be an organic insulating layer including (e.g., being) an organic material.

A second data conductor is located on the second interlayer insulating layer ILD2. The second data conductor includes a bridge pattern BRP coupling (e.g., connecting) the pixel circuit layer PCL and the display element layer DPL. The second data conductor may further include a driving voltage line, a driving low voltage line, and/or the like. The bridge pattern BRP may be coupled (e.g., connected) to a first electrode ELT1 of a light emitting element LD of each respective pixel PX through a contact hole CH. In an example, the light emitting element LD may be an organic light emitting diode or at least one subminiature inorganic light emitting diode.

The passivation layer PSV is located on the second data conductor. The passivation layer PSV may include at least one organic insulating layer, and may substantially planarize a surface of the pixel circuit layer PCL. The passivation layer PSV may be configured as a single layer or a multi-layer, and may include (e.g., be) an inorganic insulating material and/or an organic insulating material. For example, the passivation layer PSV may include (e.g., be) at least one selected from polyacrylates resin, epoxy resin, phenolic resin, polyamides resin, and polyimides resin.

The display element layer DPL is located on the pixel circuit layer PCL including the passivation layer PSV. The contact hole CH of the passivation layer PSV may couple (e.g., connect) the bridge pattern BRP of the pixel circuit layer PCL to the first electrode ELT1 of the display element layer DPL.

The display element layer DPL includes a light emitting element LD of each of the pixels PX and electrodes coupled (e.g., connected) to the light emitting element LD. The light emitting element LD may be a subminiature inorganic light emitting diode, which may be small to a degree of (e.g., which may have a size, for example, a length, in a) nanometer scale to micrometer scale, and which may be provided in a structure in which a nitride-based semiconductor is grown. In an embodiment, each light emitting element LD may be a subminiature inorganic light emitting diode having a pillar shape of which the aspect ratio is greater than 1, but the present disclosure is not limited thereto.

The display element DPL includes a first bank BNK1, a second bank BNK2, a first electrode ELT1, a second electrode ELT2, a first insulating layer INS1, a second insulating layer INS2, a first contact electrode CNE1, and a second contact electrode CNE2.

The first bank BNK1 is located on the passivation layer PSV. The first bank BNK1 may be located in an emission area (EA shown in the following drawings, for example, in FIG. 5) in which light is emitted in each pixel PX. The first bank BNK1 may be disposed on the bottom of a portion of each of the first electrode ELT1 and the second electrode ELT2 to allow the portion of each of the first electrode ELT1 and the second electrode ELT2 to protrude in an upper direction of each pixel PX, e.g., in a third direction DR3, so that light emitted from the light emitting element LD is guided in an image display direction (e.g., the upper direction, e.g., the third direction DR3) of the display device. The first bank BNK1 may include an inorganic insulating layer made of an inorganic material and/or an organic insulating layer made of an organic material. In some embodiments, the first bank BNK1 may include a single-layered organic insulating layer or a single-layered inorganic insulating layer, but the present disclosure is not limited thereto.

The second bank BNK2 is located on the passivation layer PSV. The second bank BNK2 is a structure defining the emission area (EA shown in some of the following drawings, for example, in FIG. 5) of each of the pixels PX, and may be located in a non-emission area (NEA shown in some of the following drawings, for example, in FIG. 5) of each pixel PX and in a non-emission area (NEA shown in some of the following drawings, for example, in FIG. 5) between the pixels PX to be around (e.g., to surround) the emission area (EA shown in some of the following drawings, for example, in FIG. 5) of each of the pixels PX. For example, the second bank BNK2 may be a pixel defining layer and/or a dam structure. The second bank BNK2 may include (e.g., be) at least one light blocking material and/or at least one reflective material. In some embodiments, the second bank BNK2 along with a first light blocking pattern LBP1, which will be described later, while overlapping with the first light blocking pattern LBP1 may implement a dam structure for determining a supply (or input) area of light emitting elements LD in each pixel PX. For example, the dam structure may define an area where light emitting elements LD for each pixel PX are to be formed.

Each of the first electrode ELT1 and the second electrode ELT2 is located on the first bank BNK1, and has a surface corresponding to the shape of the first bank BNK1. The first electrode ELT1 and the second electrode ELT2 may include (e.g., be) a material having uniform reflexibility (e.g., uniform reflectivity). Accordingly, light emitted from the light emitting element LD may advance in the image display direction (e.g., the third direction DR3) of the display device due to the first electrode ELT1 and the second electrode ELT2.

The first electrode ELT1 may be electrically coupled (e.g., connected) to the first electrode TE1 of the transistor M through the contact hole CH penetrating the passivation layer PSV. The second electrode ELT2 may be coupled (e.g., connected) to a driving power source through at least one contact hole penetrating the passivation layer PSV in an area (e.g., a planar area where the contact hole penetrates through the passivation layer PSV). In an embodiment, the first electrode ELT1 may be an anode, and the second electrode ELT2 may be a cathode. Each of the first electrode ELT1 and the second electrode ELT2 may be an ohmic contact electrode or a Schottky contact electrode, but the present disclosure is not limited thereto.

The first insulating layer INS1 may be located between each of the first electrode ELT1 and the second electrode ELT2 and the passivation layer PSV (e.g., between the first electrode ELT1 and the passivation layer PSV and between the second electrode ELT2 and the passivation layer PSV). The first insulating layer INS1 fills a space between the light emitting element LD and the passivation layer PSV, thereby stably supporting the light emitting element LD. The first insulating layer INS1 may include (e.g., be) at least one selected from among an inorganic insulating layer and an organic insulating layer, and may be configured as a single layer or a multi-layer. For example, the first insulating layer INS1 may include (e.g., be) at least one selected from among an inorganic insulating material and an organic insulating material.

The light emitting element LD is located on the first insulating layer INS1. At least one light emitting element LD may be disposed between the first electrode ELT1 and the second electrode ELT2 (e.g., disposed between the first electrode ELT1 and the second electrode ELT2 along a horizontal direction, for example, the first direction DR1). In some embodiments, a plurality of light emitting elements LD may be disposed between the first electrode ELT1 and the second electrode ELT2. The plurality of light emitting elements LD may be coupled (e.g., connected) in parallel to each other.

Each of the light emitting elements LD may emit light of any one selected from a predetermined or set color, white, and blue. In an embodiment, the light emitting elements LD may be provided in a form which can be sprayed into a solution, to be input to each pixel PX.

The light emitting element LD may include a first semiconductor layer SCL1, an active layer ACT, and a second semiconductor layer SCL2, which are sequentially disposed in the first direction DR1. The light emitting element LD may further include an insulating film around (e.g., surrounding) the outer circumference of the first semiconductor layer SCL1, the active layer ACT, and the second semiconductor layer SCL2.

The first semiconductor layer SCL1 may include (e.g., be) a first type (e.g., kind) semiconductor. For example, the first semiconductor layer SCL1 may include (e.g., be) at least one p-type (e.g., p-based) semiconductor layer. In an example, the first semiconductor layer SCL1 may include at least one semiconductor material selected from among InAlGaN, GaN, AlGaN, InGaN, AlN, and InN, and may include a p-type (e.g., p-based) semiconductor layer doped with a first type (e.g., kind) dopant (or p-type dopant (e.g., p-based dopant)) such as Mg. In some embodiments, the first semiconductor layer SCL1 may include a semiconductor material doped with a first type (e.g., kind) dopant (e.g., a p-type dopant (e.g., p-based dopant)), and the semiconductor material may include at least one semiconductor material selected from among InAlGaN, GaN, AlGaN, InGaN, AlN, and InN.

The active layer ACT may be formed in a single-quantum well structure or a multi-quantum well structure. In some embodiments, a material such as AlGaN and/or AlInGaN may be utilized (e.g., used) to form the active layer ACT. In addition, the active layer ACT may be formed of various suitable materials. The position of the active layer ACT may be variously and suitably changed according to the kind of the light emitting element LD. The active layer ACT may emit light having a wavelength of 400 nm to 900 nm, and may utilize (e.g., use) a double hetero-structure.

The second semiconductor layer SCL2 may include a semiconductor layer having a type (e.g., kind) different from that of the first semiconductor layer SCL1. For example, the second semiconductor layer SCL2 may include at least one n-type (e.g., n-based) semiconductor layer. In an example, the second semiconductor layer SCL2 may include at least one semiconductor material selected from among InAlGaN, GaN, AlGaN, InGaN, AlN, and InN, and may be an n-type (e.g., n-based) semiconductor layer doped with a second type (e.g., kind) dopant (or an n-type dopant (e.g., n-based dopant)) such as Si, Ge and/or Sn. In some embodiments, the second semiconductor layer SCL2 may include a semiconductor material doped with the second type (e.g., kind) dopant (e.g., an n-type dopant (e.g., n-based dopant)), and the semiconductor material may include (e.g., be) at least one selected from among InAlGaN, GaN, AlGaN, InGaN, AlN, and InN.

One end portion of the light emitting element LD toward (or at) the first semiconductor layer SCL1 may be referred to as a first end portion EP1 of the light emitting element LD, and another end of the light emitting element LD toward (or at) the second semiconductor layer SCL2 may be referred to as a second end portion EP2 of the light emitting element LD.

The second insulating layer INS2 is located on a portion of the light emitting element LD. The second insulating layer INS2 may cover a partial top surface of each of the light emitting elements LD, and may expose the first end portion EP1 and the second end portion EP2. For example, the second insulating layer INS2 may cover a part (e.g., a center part) of a top surface of the light emitting element LD and may expose a part of the top surface of the light emitting element LD at, or corresponding to, the first end portion EP1 and the second end portion EP2. The second insulating layer INS2 may stably fix the light emitting element LD. When an empty space exists between the first insulating layer INS1 and the light emitting element LD before the second insulating layer INS2 (e.g., before the second insulating layer INS2 is formed), the empty space may be at least partially filled by the second insulating layer INS2.

The first contact electrode CNE1, which electrically and physically couples (e.g., connects) the first electrode ELT1 to one end portion (e.g., the first end portion EP1) of both of the end portions of the light emitting element LD is located on the first electrode ELT1. The first contact electrode CNE1 may be located to overlap with portions of the first insulating layer INS1, the second insulating layer INS2, and the light emitting element LD. The first insulating layer INS1 may be removed at (e.g., may have an opening exposing) a portion at which the first electrode ELT1 and the first contact electrode CNE1 are coupled (e.g., connected) to each other, e.g., a portion at which the first electrode ELT1 and the first contact electrode CNE1 are in direct contact with each other.

The second contact electrode CNE2, which electrically and physically couples (e.g., connects) the second electrode ELT2 to one end portion (e.g., the second end portion EP2) of both of the end portions of the light emitting element LD is located on the second electrode ELT2. The second contact electrode CNE2 may be located to overlap with portions of the first insulating layer INS1, the second insulating layer INS2, and the light emitting element LD. The first insulating layer INS1 may be removed at (e.g., may have an opening exposing) a portion at which the second electrode ELT2 and the second contact electrode CNE2 are coupled (e.g., connected) to each other, e.g., a portion at which the second electrode ELT2 and the second contact electrode CNE2 are in direct contact with each other.

The first contact electrode CNE1 and the second contact electrode CNE2 may each be made of a transparent conductive material. For example, the first contact electrode CNE1 and the second contact electrode CNE2 may each include (e.g., be) a material such as Indium Tin Oxide (ITO), Indium Zinc Oxide (IZO), and/or Indium Tin Zinc Oxide (ITZO). Accordingly, light which is emitted from the light emitting element LD and then reflected by the first electrode ELT1 and the second ELT2 may advance in the image display direction (e.g., the third direction DR3) of the display device.

The third insulating layer INS3 is located on the first contact electrode CNE1, the second contact electrode CNE2, and the second bank BNK2. The third insulating layer INS3 may include at least one organic layer and/or at least one inorganic layer. In some embodiments, the third insulating layer INS3 may be entirely located on a surface of the display element layer DPL (e.g., located on the entire surface of the display element layer DPL).

Referring to FIGS. 4-7, a first display device DD1 and a second display device DD2 may be disposed such that non-display areas NA thereof are adjacent to each other. The first display device DD1 and the second display device DD2 may have side surfaces in contact with each other on a section, and the side surfaces of the first display device DD1 and the second display device DD2 may be coupled (e.g., connected) to each other by an adhesive material.

Figure 4:
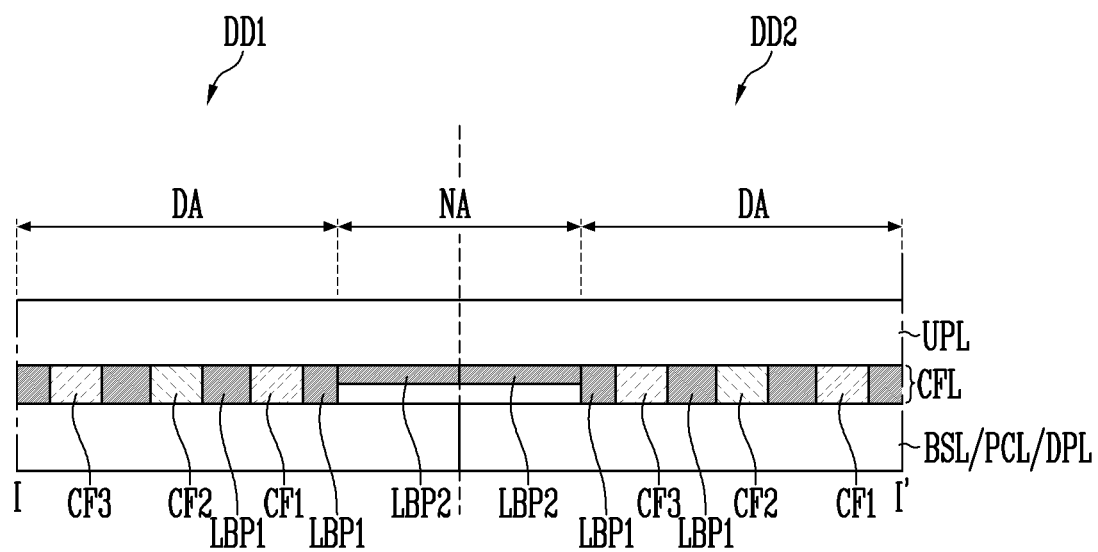
FIGS. 4-7 are each a cross sectional view of a display device in accordance with an embodiment.
Figure 4:
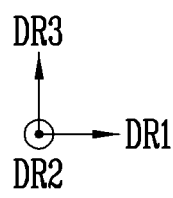
Figure 4:
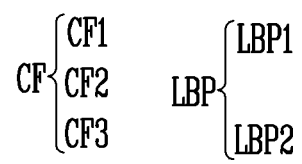

Referring to FIG. 4, the first display device DD1 and the second display device DD2 are arranged in parallel to each other in the first direction DR1. Accordingly, a boundary area between the first display device DD1 and the second display device DD2, e.g., a right non-display area NA of the first display device DD1 and a left non-display area NA of the second display device DD2 form one non-display area NA.

Because an intensity of light emitted from the outside of a display area DA is relatively lower than that of light emitted from the inside of the display area DA, a user can easily recognize the non-display area NA between the first display device DD1 and the second display device DD2. However, in the display device in accordance with the embodiment, a thickness of a light blocking pattern LBP2 in the non-display area NA is formed thinner than that of a light blocking pattern LBP1 in the display area DA, so that the transmittance of light can be increased (e.g., so that transmittance of light in the non-display area NA can be increased). The light blocking patterns LBP1 and LBP2 formed in the display area DA and the non-display area NA will be described in more detail in a structure which will be described later.

In FIGS. 4-7, a base layer BSL, a pixel circuit layer PCL, and a display element layer DPL are briefly illustrated. However, the pixel circuit layer PCL and the display element layer DPL, which are shown in FIGS. 4-7, may correspond to the pixel circuit layer PCL and the display element layer DPL, which are shown in FIG. 3.

Figure 5:
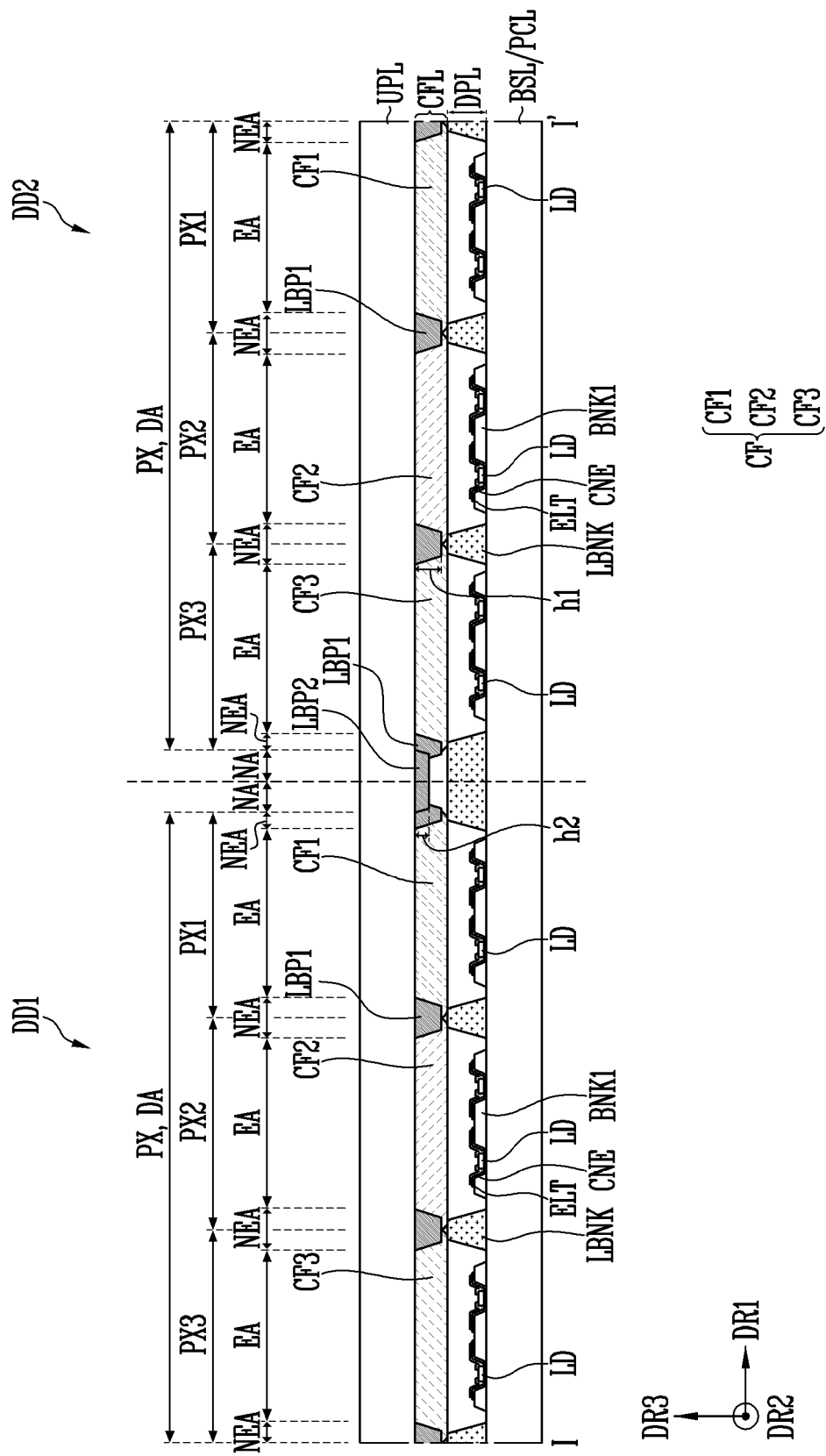
Figure 6:
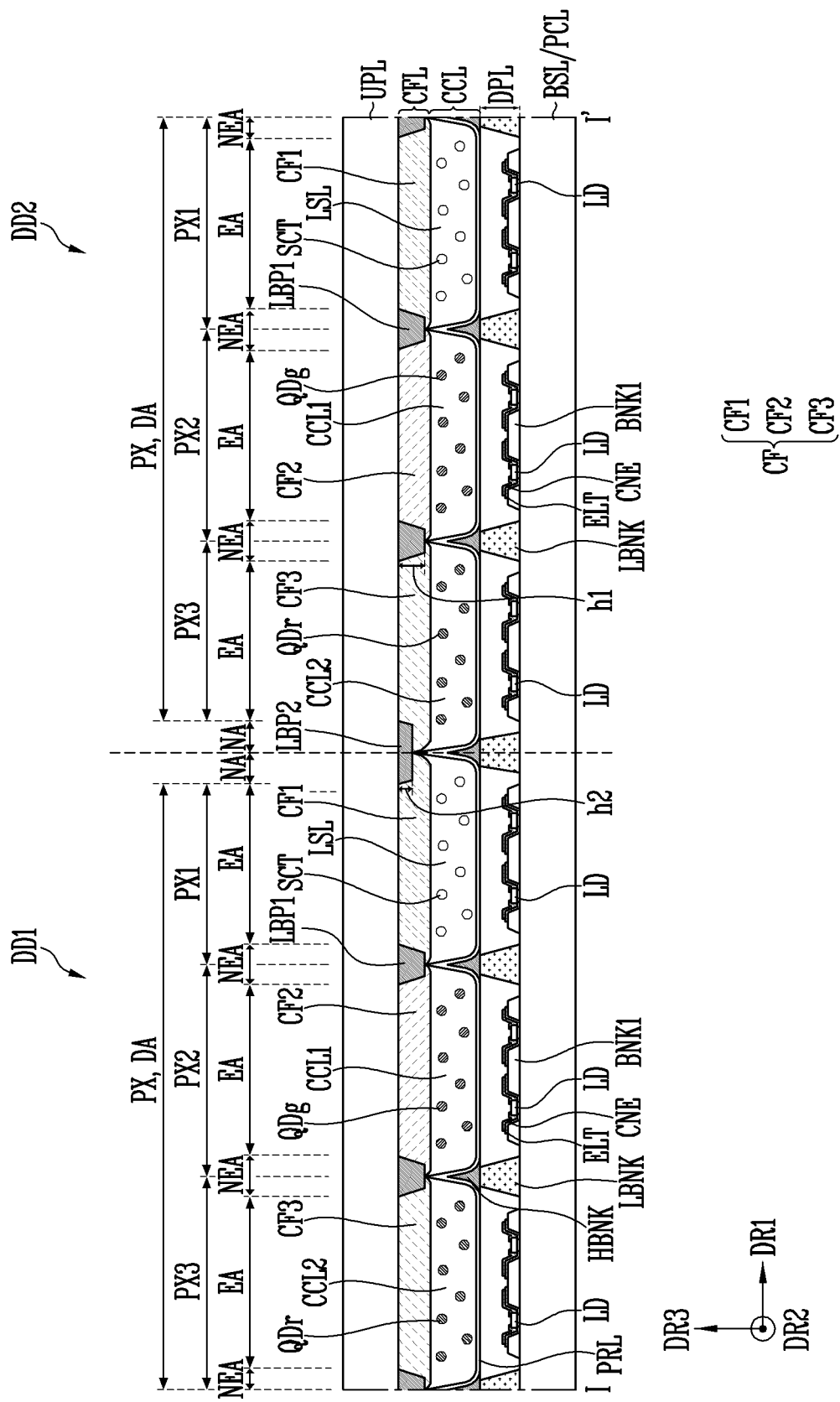
Figure 7:
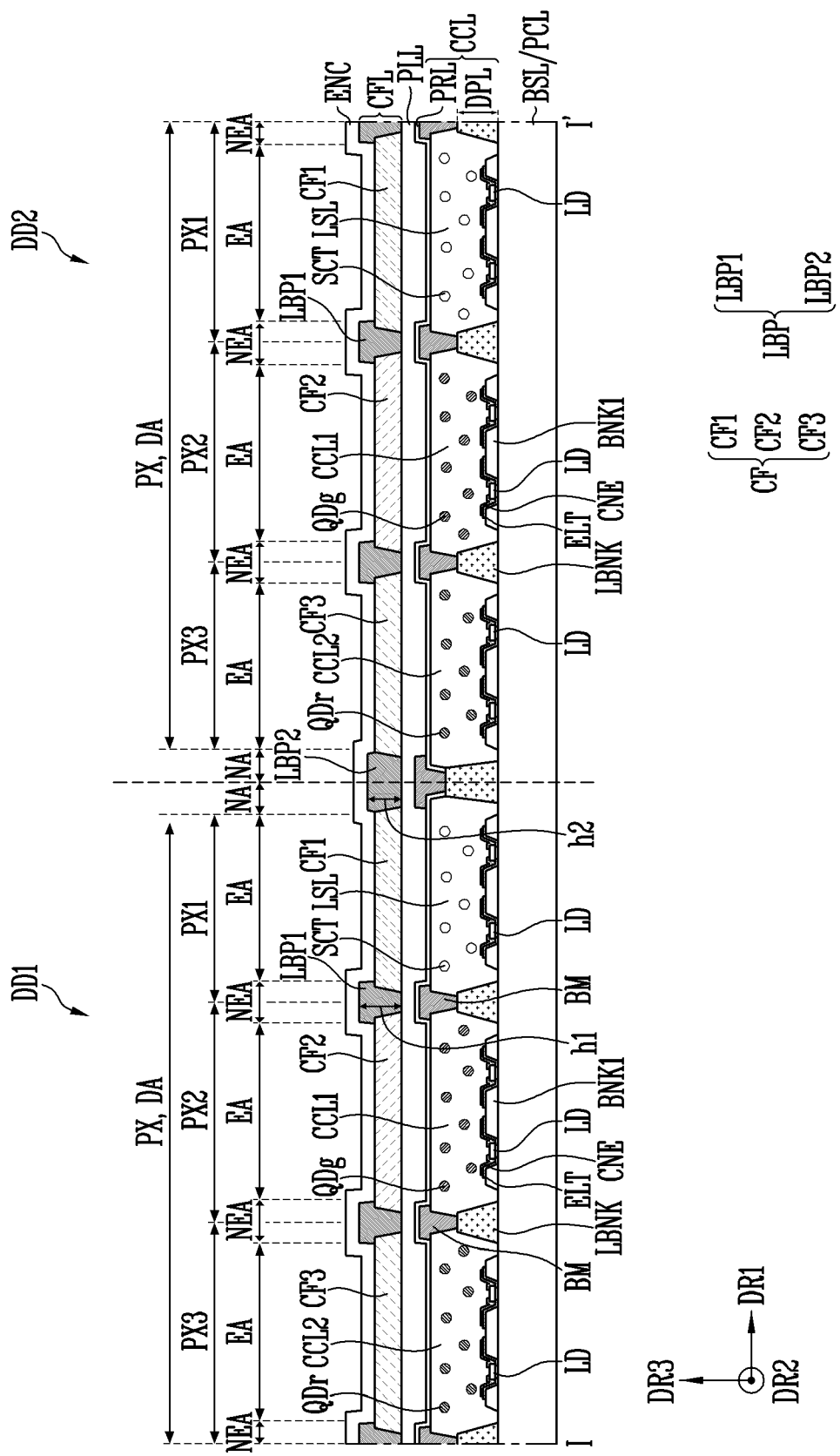

Referring to FIGS. 5-7, in the first display device DD1 and the second display device DD2, each pixel PX includes a first sub-pixel PX1, a second sub-pixel PX2, and a third sub-pixel PX3. For example, a first sub-pixel PX1 of the first display device DD1 may be disposed at an outermost portion (e.g., at a position farthest in the first direction DR1 or at a position closest to the non-display area NA between the first and second display devices DD1 and DD2) of the first display device DD1, and a third sub-pixel PX3 of the second display device DD2 may be disposed at an outermost portion (e.g., at a position farthest in a direction opposite to the first direction DR1 or at a position closest to the non-display area NA between the first and second display devices DD1 and DD2) of the second display device DD2. In an embodiment, the first sub-pixel PX1 of the first display device DD1 and the third sub-pixel PX3 of the second display device DD2 may be located side by side in the first direction DR1 (e.g., adjacent to each other in the first direction DR1), but the present disclosure is not limited thereto.

The first to third sub-pixels PX1, PX2, and PX3 may include emission areas EA located in the first to third sub-pixels PX1, PX2, and PX3, respectively, and may include non-emission areas NEA located between the emission areas EA of the first to third sub-pixels PX1, PX2, and PX3. For example, the first sub-pixel PX1 may include an emission area EA, a non-emission area NEA located between the emission area EA of the first sub-pixel PX1 and an emission area EA of the second sub-pixel PX2, and a non-emission area NEA located between the emission area EA of the first sub-pixel PX1 and a non-display area NA. The second sub-pixel PX2 may include the emission area EA, a non-emission area NEA located between the emission area EA of the second sub-pixel PX2 and an emission area EA of the third sub-pixel PX3, and the non-emission area NEA located between the emission area EA of the first sub-pixel PX1 and the emission area EA of the second sub-pixel PX2. Most of the emission areas EA and the non-emission areas NEA may be included in the display area DA. In some embodiments, a sub-pixel adjacent to the non-display area NA may not include any non-emission area NEA between the non-display area NA and an emission area EA of the sub-pixel. Accordingly, the emission area EA of the sub-pixel adjacent to the non-display area NA may be located immediately adjacent to the non-display area NA.

A more detailed structure will be described with reference to FIGS. 5 and 6. The display device in accordance with the embodiment may further include a color filter layer CFL, a light conversion layer LCL, and an upper substrate UPL, which are illustrated to be on the display element layer DPL.

The upper substrate UPL is disposed on the display element layer DPL to face (e.g., to overlap) the base layer BSL. The upper substrate UPL may encapsulate the display element layer DPL on the one surface of the base layer BSL. For example, the upper substrate UPL may encapsulate an upper surface of the display element layer DPL. The upper substrate UPL may be a rigid or flexible substrate (or film). In an embodiment, when the upper substrate UPL is the rigid substrate, the upper substrate UPL may include (e.g., be) at least one selected from among a glass substrate, a quartz substrate, a glass ceramic substrate, and a crystalline glass substrate. In some embodiments, when the upper substrate UPL is the flexible substrate, the upper substrate UPL may include (e.g., be) at least one selected from among a film substrate and a plastic substrate, each of which may include (e.g., be) a polymer organic material. In some embodiments, the upper substrate UPL may include (e.g., be) a Fiber glass Reinforced Plastic (FRP).

The color filter layer CFL is disposed on one surface (e.g., a lower surface) of the upper substrate UPL, which faces the base layer BSL. The color filter layer CFL may be entirely disposed in the emission area EA, and may be disposed in a portion of the non-emission area NEA. For example, the color filter layer CFL may overlap the entire emission area EA and may overlap at least a portion of the non-emission area NEA.

The color filter layer CFL may include a color filter CF corresponding to each of the first to third sub-pixels PX1, PX2, and PX3. For example, the color filter layer CFL may include a first color filter CF1 disposed at an upper portion of the first sub-pixel PX1 to allow light generated from the first sub-pixel PX1 to be selectively transmitted therethrough, a second color filter CF2 disposed at an upper portion of the second sub-pixel PX2 to allow light generated from the second sub-pixel PX2 to be selectively transmitted therethrough, and a third color filter CF3 disposed at an upper portion of the third sub-pixel PX3 to allow light generated from the third sub-pixel PX3 to be selectively transmitted therethrough. In an embodiment, the first color filter CF1, the second color filter CF2, and the third color filter CF3 may be respectively a blue color filter, a green color filter, and a red color filter, but the present disclosure is not limited thereto.

The first color filter CF1 may include (e.g., be) a color filter material which allows light of a first color, which is generated from the first sub-pixel PX1, to be selectively transmitted therethrough. For example, when the first sub-pixel PX1 is a blue pixel, the first color filter CF1 may include (e.g., be) a blue color filter material.

The second color filter CF2 may include (e.g., be) a color filter material which allows light of a second color, which is generated from the second sub-pixel PX2, to be selectively transmitted therethrough. For example, when the second sub-pixel PX2 is a green pixel, the second color filter CF2 may include (e.g., be) a green color filter material.

The third color filter CF3 may include (e.g., be) a color filter material which allows light of a third color, which is generated from the third sub-pixel PX3, to be selectively transmitted therethrough. For example, when the third sub-pixel PX3 is a red pixel, the third color filter CF3 may include (e.g., be) a red color filter material.

The color filter layer CFL may further include a light blocking pattern LBP. The light blocking pattern LBP includes a first light blocking pattern LBP1 disposed in the non-emission area NEA and a second light blocking pattern LBP2 disposed in the non-display area NA.

The first light blocking pattern LBP1 may be disposed on the one surface (e.g., lower surface) of the upper substrate UPL to face (e.g., overlap) a lower bank LBNK. In an embodiment, the lower bank LBNK may be the second bank BNK2 described with reference to FIG. 3. The first light blocking pattern LBP1 may be located in the color filter layer CFL to correspond to (e.g., to overlap) the second bank BNK2.

The first light blocking pattern LBP1 may be disposed between two color filters CF adjacent to each other in the first direction DR1 among the first to third color filters CF1, CF2, and CF3. For example, the first light blocking pattern LBP1 may be disposed between the first color filter CF1 and the second color filter CF2. Also, the first light blocking pattern LBP1 may be disposed to overlap with an edge of each of the first to third color filters CF1, CF2, and CF3. For example, a breadth of the first light blocking pattern LBP1 at an upper surface of the first light blocking pattern LBP1 may be greater than a breadth of the first light blocking pattern LBP1 at a lower surface of the first light blocking pattern LBP1 such that at least a portion of the first light blocking pattern LBP1 overlaps an adjacent color filter selected from among the first to third color filters CF1, CF2, and CF3 in the plan view. Also, the first light blocking pattern LBP1 may be disposed to overlap with the edge of the first color filter CF1 in the outermost non-emission area NEA of the first display device DD1, and may be disposed to overlap with the edge of the third color filter CF in the outermost non-emission area NEA of the second display device DD2.

The second light blocking pattern LBP2 may be located in a boundary area (the seam area or the non-display area NA) between the first display device DD1 and the second display device DD2. In an embodiment, the second light blocking pattern LBP2 may be located in the color filter layer CFL to overlap (e.g., overlap in the plan view) with each of at least a portion of the first color filter CF1 of the first sub-pixel PX1 located at the outermost portion in the first display device DD1 and at least a portion of the third color filter CF3 of the third sub-pixel PX3 located at the outermost portion in the second display device DD2. However, the present disclosure is not limited thereto. In some embodiments, the second light blocking pattern LBP2 may be located in the color filter layer CFL in a shape extending from or overlapping with each of at least a portion of the first light blocking pattern LBP1 of the first sub-pixel PX1 located at the outermost portion in the first display device DD1 and at least a portion of the first light blocking pattern LBP1 of the third sub-pixel PX3 located at the outermost portion in the second display device DD2. For example, a first portion (e.g., a left portion) of the second light blocking pattern LBP2 may overlap at least a portion of the first light blocking pattern LBP1 at an edge (e.g., a right edge) of the first display device DD1 adjacent to the non-display area NA between the first and second display devices DD1 and DD2, a second portion (e.g., a right portion) of the second light blocking pattern LBP2 may overlap at least a portion of the first light blocking pattern LBP1 at an edge (e.g., a left edge) of the second display device DD2 adjacent to the non-display area NA between the first and second display devices DD1 and DD2, and a third portion (e.g., a center portion) of the second light blocking pattern LBP2 may extend between the first and second portions of the second light blocking pattern LBP2. An organic layer and/or an air layer may be located between the second light blocking pattern LBP2 and the lower bank LBNK facing (e.g., overlapping) the second light blocking pattern LBP2.

The second light blocking pattern LBP2 has a thickness different from that of the first light blocking pattern LBP1 in the third direction DR3. For example, a thickness h2 of the second light blocking pattern LBP2 may be thinner than a thickness h1 of the first light blocking pattern LBP1. For example, the thickness h2 of the second light blocking pattern LBP2 may be 1 µm or less, and the thickness h1 of the first light blocking pattern LBP1 may be 1 µm or more. For example, the thickness of the second light blocking pattern LBP2 may be 0.5 µm, and the thickness of the first light blocking pattern LBP1 may be 1.2 µm.

Accordingly, in the non-display area NA of the display device DD, light transmittance may be increased, as compared with a case where the first light blocking pattern LBP1 and the second light blocking pattern LBP2 are formed with the same thickness. Thus, although a plurality of display devices are disposed, the visibility of the boundary area (the seam area, the non-display area NA, etc.) between the display devices and the non-display area NA can be weakened or diminished, and the luminance of the plurality of display devices can be increased.

The first light blocking patterns LBP1 and the second light blocking patterns LBP2 may be located in the same layer, and may be formed through the same process or different processes. In an example, the first light blocking patterns LBP1 and the second light blocking patterns LBP2 may be formed by performing a mask process utilizing (e.g., using) a half tone mask.

The light blocking pattern LBP may include (e.g., be) at least one black matrix material (e.g., at least one light blocking material known or generally available in the related art) among various suitable kinds of black matrix materials, a color filter material of a specific color, and/or the like. Also, the light blocking pattern LBP may include (e.g., be) the same material as the lower bank LBNK, but the present disclosure is not limited thereto. For example, the light blocking pattern LBP and the lower bank LBNK may include (e.g., be) the same material or different materials.

In an embodiment, a space between a lower plate of the display device, which includes the base layer BSL, the display element layer DPL, and the like, and an upper plate of the display device, which includes the upper substrate UPL, the color filter layer CFL, and the like, may be filled with a set or predetermined filling material having a low refractive index (index of refraction) such that light emitted from the light emitting element LD can be smoothly emitted in the third direction DR3. In an embodiment, the space between the lower plate and the upper plate of the display device may be filled with an air layer.

Referring to FIG. 6, the display device in accordance with the embodiment may include a color conversion layer CCL disposed on one color filter layer CFL (e.g., on a lower surface of the color filter layer CFL) to face (e.g., to overlap) one surface (e.g., an upper surface) of the base layer BSL.

The color conversion layer CCL is utilized (e.g., used) to convert light emitted from the display element layer DPL, and includes a color conversion particle (e.g., a quantum dot) corresponding to a set or predetermined color, so that light generated in the display element layer DPL can be converted. For example, the color conversion layer CCL along with the color filter layer CFL may allow light emitted from the light emitting element LD to be selectively transmitted therethrough, and may convert the light emitted from the light emitting element LD.

The color conversion layer CCL includes a light scattering layer LSL, a first color conversion layer CCL1, and a second color conversion layer CCL2.

The light scattering layer LSL may be disposed on one surface (e.g., a lower surface) of the first color filter CF1, and may include light scattering particles SCT. The light scattering particles SCT may be titanium oxide ($Ti_xO_y$), for example, titanium dioxide ($TiO_2$), silica, and/or the like, but the present disclosure is not limited thereto. Because the light scattering layer LSL enables light emitted from the light emitting element LD to be transmitted therethrough, the first color filter CF1 may be a blue color filter, when the first sub-pixel PX1 is a blue pixel.

The first color conversion layer CCL1 may be disposed on one surface (e.g., a lower surface) of the second color filter CF2, and may include first color conversion particles corresponding to the second color. The first color conversion particles may include (e.g., be) a green quantum dot QDg for converting blue light emitted from the light emitting element LD into green light. The green quantum dot QDg may absorb blue light and emit green light having a wavelength band of about 500 nm to 570 nm by shifting a wavelength of the blue light according to energy transition. When the second sub-pixel PX2 is a green pixel, the second color filter CF2 may be a green color filter. In some embodiments, when the second sub-pixel PX2 is a pixel of another color, the first color conversion layer CCL1 may include a first quantum dot corresponding to the color of the second sub-pixel PX2.

The second color conversion layer CCL2 may be disposed on one surface (e.g., a lower surface) of the third color filter CF3, and may include second color conversion particles corresponding to the third color. The second color conversion particles may include (e.g., be) a red quantum dot QDr for converting blue light emitted from the light emitting element LD into red light. The red quantum dot QDr may absorb blue light and emit red light having a wavelength band of about 620 nm to about 780 nm (e.g., of 620 nm to 780 nm) by shifting a wavelength of the blue light according to energy transition. When the third sub-pixel PX3 is a red pixel, the third color filter CF3 may be a red color filter. In some embodiments, when the third sub-pixel PX3 is a pixel of another color, the second color conversion layer CCL2 may include a second quantum dot corresponding to the color of the third sub-pixel PX3.

A protective layer PRL may be disposed on surfaces (e.g., lower surfaces) of the light scattering layer LSL, the first color conversion layer CCL1, and the second color conversion layer CCL2. The protective layer PRL may be configured as a single layer or a multi-layer, which includes (e.g., is) an inorganic material and/or an organic material.

An upper bank HBNK may be disposed among the light scattering layer LSL, the first color conversion layer CCL1, and the second color conversion layer CCL2. For example, at least a portion (e.g., an upper portion) of the upper bank HBNK may be interspaced between the light scattering layer LSL, the first color conversion layer CCL1, and the second color conversion layer CCL2 along a horizontal direction, for example, along the first direction DR1. The upper bank HBNK may be disposed to overlap with the first light blocking pattern LBP1 located on the one surface (e.g., lower surface) of the upper substrate UPL and to overlap with the lower bank LBNK located on the one surface (e.g., upper surface) of the base layer BSL. The lower bank LBNK and the upper bank HBNK may include (e.g., be) the same material as the light blocking pattern LBP. In some embodiments, a pattern capable of blocking light may also be disposed among the light scattering layer LSL, the first color conversion layer CCL1, and the second color conversion layer CCL2.

A forming order of the light scattering layer LSL, the first color conversion layer CCL1, the second color conversion layer CCL2, and the light blocking patterns LBP1 and LBP2, positions according thereto (e.g., relative positions thereof), and/or shapes according thereto (e.g., shapes thereof, for example, planar shapes thereof) may be variously and suitably changed in some embodiments.

In the display device shown in FIGS. 5 and 6, a sealant (e.g., transparent sealant) may be disposed between the emission area EA located at the outermost portion of the display area DA and the non-display area NA, and the lower plate including the base layer BSL and the upper substrate UPL may be bonded to each other by the sealant (e.g., transparent sealant).

Although an embodiment in which the upper substrate UPL is disposed on the top of the base layer BSL has been disclosed in FIGS. 5 and 6, the present disclosure is not limited thereto. For example, the color filter CF and the light blocking layer LBP may be formed on one surface of the base layer BSL, and the one surface of the base layer BSL may be encapsulated by utilizing (e.g., using) a thin film encapsulation layer, etc.

Referring to FIG. 7, the display device in accordance with the embodiment may include a color filter layer CFL, a color conversion layer CCL, and first and second light blocking patterns LBP1 and LBP2 of first to third color filters CF1, CF2, and CF3. The color conversion layer CCL and the color filter layer CFL may be sequentially stacked on one surface (e.g., upper surface) of the base layer BSL. Also, the display device may further include a planarization layer PLL located between the color conversion layer CCL and the color filter layer CFL, and an encapsulation layer ENC located on the color filter layer CFL.

The planarization layer PLL may be configured as a single layer or a multi-layer, which includes at least one organic layer. For example, the planarization layer PLL may include a low-refractive organic layer, and accordingly, the light efficiency of the pixel PX can be ensured.

The encapsulation layer ENC covers one surface of the first to third color filters CF1, CF2, and CF3, and the first and second light blocking patterns LBP1 and LBP2, thereby encapsulating the display area DA and/or the non-display area NA.

The encapsulation layer ENC may be configured as a multi-layer including at least one organic layer and/or at least one inorganic layer. For example, the encapsulation layer ENC may be configured as a triple-layer in which at least one inorganic layer, at least one organic layer, and at least one inorganic layer are sequentially stacked on the one surface of the first to third color filters CF1, CF2, and CF3, and the first and second light blocking patterns LBP1 and LBP2. However, the structure of the encapsulation layer ENC is not limited thereto. The material constituting the encapsulation layer ENC and/or the structure of the encapsulation layer ENC may be variously and suitably changed in some embodiments.

In some embodiments, a pattern capable of blocking light may be additionally disposed among the light scattering layer LSL, the first color conversion layer CCL1, and the second color conversion layer CCL2. For example, a black matrix BM may be disposed among the light scattering layer LSL, the first color conversion layer CCL1, and the second color conversion layer CCL2. The black matrix pattern BM may be formed of the same material as the lower bank LBNK and/or as the first light blocking pattern LBP1, but the present disclosure is not limited thereto. For example, the black matrix pattern BM, the lower bank LBNK, and/or the first light blocking pattern LBP1 may include (e.g., be) the same material or different materials. Also, in some embodiments, the lower bank LBNK along with the black matrix pattern BM, while overlapping with the black matrix pattern BM (e.g., collectively with the black matrix pattern BM), may implement a dam structure for determining a supply (or input) area of light emitting elements LD in each pixel PX.

A thickness h2 of the second light blocking pattern LBP2 shown in FIGS. 5-7 may be thinner than a thickness h1 of the first light blocking pattern LBP1 shown in FIGS. 5-7, respectively. For example, the thickness h2 of the second light blocking pattern LBP2 may be 1 μm or less, and the thickness h1 of the first light blocking pattern LBP1 may be 1 μm or more. For example, the thickness h2 of the second light blocking pattern LBP2 may be 0.5 μm, and the thickness h1 of the first light blocking pattern LBP1 may be 1.2 μm.

Accordingly, in the display device in accordance with the embodiment, the thickness of the second light blocking pattern LBP2 located in the non-display area NA is formed thinner than that of the first light blocking pattern LBP1 located in the display area DA, so that the light transmittance of the non-display area NA can be improved.

Hereinafter, an improved effect of the above-described display device in accordance with the embodiment will be described with reference to FIGS. 8 and 9.

Figure 8:
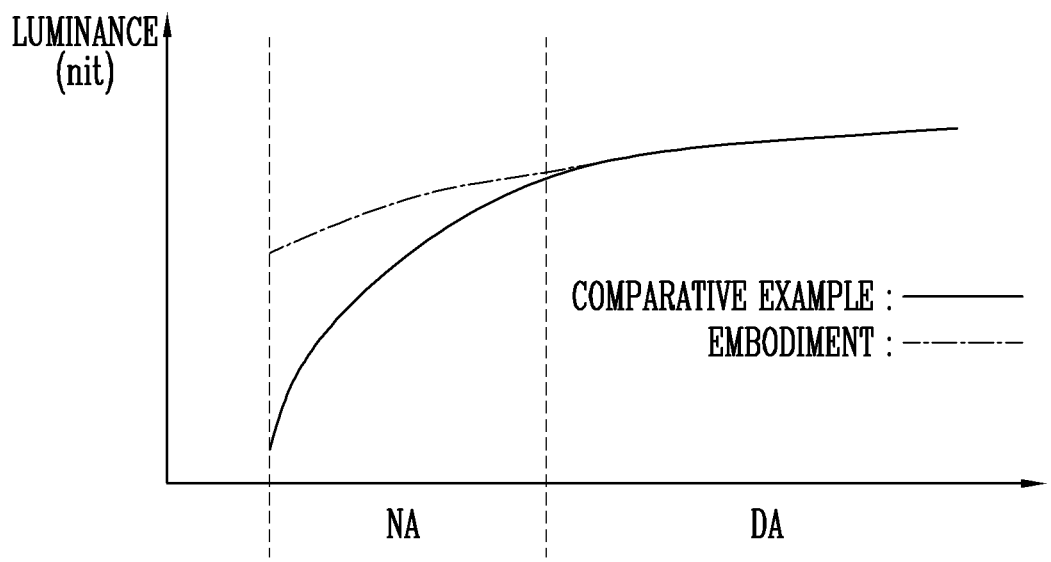
FIG. 8 is a graph illustrating a luminance change according to area of display devices in accordance with an embodiment and a comparative example.

FIG. 8 is a graph illustrating a luminance change according to area of display devices in accordance with an embodiment and a comparative example. FIG. 9 is a graph illustrating optical density according to thickness of a light blocking pattern in a display device in accordance with an embodiment. The graphs shown in FIGS. 8 and 9 illustrate an improved effect of the display device in accordance with the embodiment, which are shown in FIGS. 4-7. Hereinafter, this will be described together with reference to FIGS. 4-7.

Referring to FIG. 8, luminance of the display device in accordance with the embodiment is indicated by a dotted line, and luminance of the display device in accordance with the comparative example is indicated by a solid line.

In the display device in accordance with the embodiment, a luminance difference between the display area DA and the non-display area NA is not large. On the other hand, in the display device in accordance with the comparative example, it can be seen that luminance in the non-display area NA is remarkably decreased, as compared with the display area DA. That is, the difference in luminance between the non-display area NA and the display area DA is smaller in the embodiment compared to the comparative example.

In the display device in accordance with the comparative example, because a light blocking pattern having the same thickness is disposed in the non-display area NA and the display area DA, light transmittance in the non-display area NA is lowered, and therefore, luminance in the non-display area NA is decreased.

However, in the display device in accordance with the embodiment, a thickness of the second light blocking pattern LBP2 in the non-display area NA is formed thinner than that of the first light blocking pattern LBP1 in the display area DA, so that light transmittance can be improved. Accordingly, the luminance in the non-display area NA can be increased.

Figure 9:
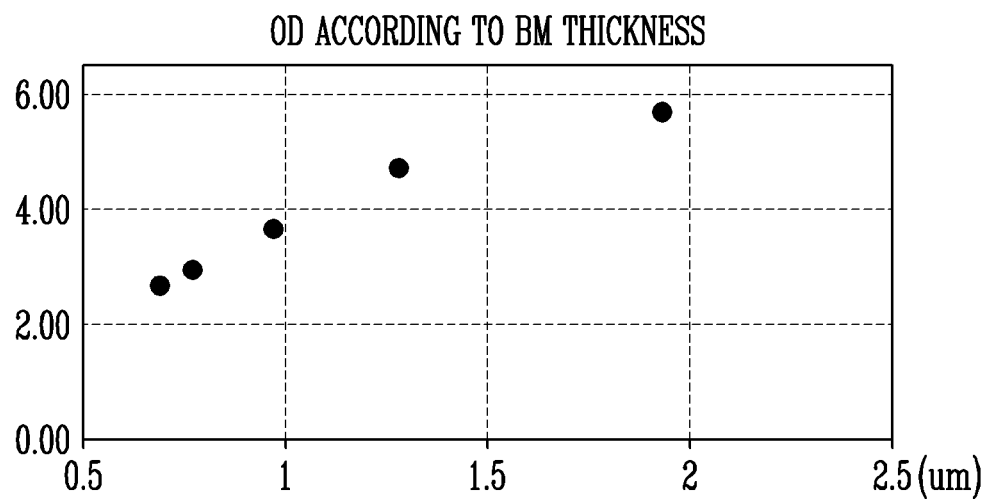
FIG. 9 is a graph illustrating optical density according to thickness of a light blocking pattern in a display device in accordance with an embodiment.

Referring to FIG. 9, Optical Density (OD) can be seen according to thickness of the light blocking pattern (BM). When the thickness of the light blocking pattern corresponds to a range of 1 μm to 1.5 μm, the OD may have a value of about 5 or less. However, when thickness of the light blocking pattern is 1 μm or less, for example, when the thickness of the light blocking pattern corresponds to about 0.75 μm, the OD may have a value of about 3. The OD corresponds to (e.g., is proportional to) a value of log(1/T) of transmittance T. Accordingly, when the thickness of the light blocking pattern is formed from 1 μm to 0.5 μm, the transmittance may be increased by about 100 times.

Thus, in the display device in accordance with the embodiment, the thickness of the second light blocking pattern LBP2 located in the non-display area NA is formed as 0.5 μm, so that the transmittance in the non-display area NA can be remarkably increased.

Hereinafter, a color filter layer in a display device in accordance with an embodiment will be mainly described with reference to FIGS. 10 to 14.

Figure 10:
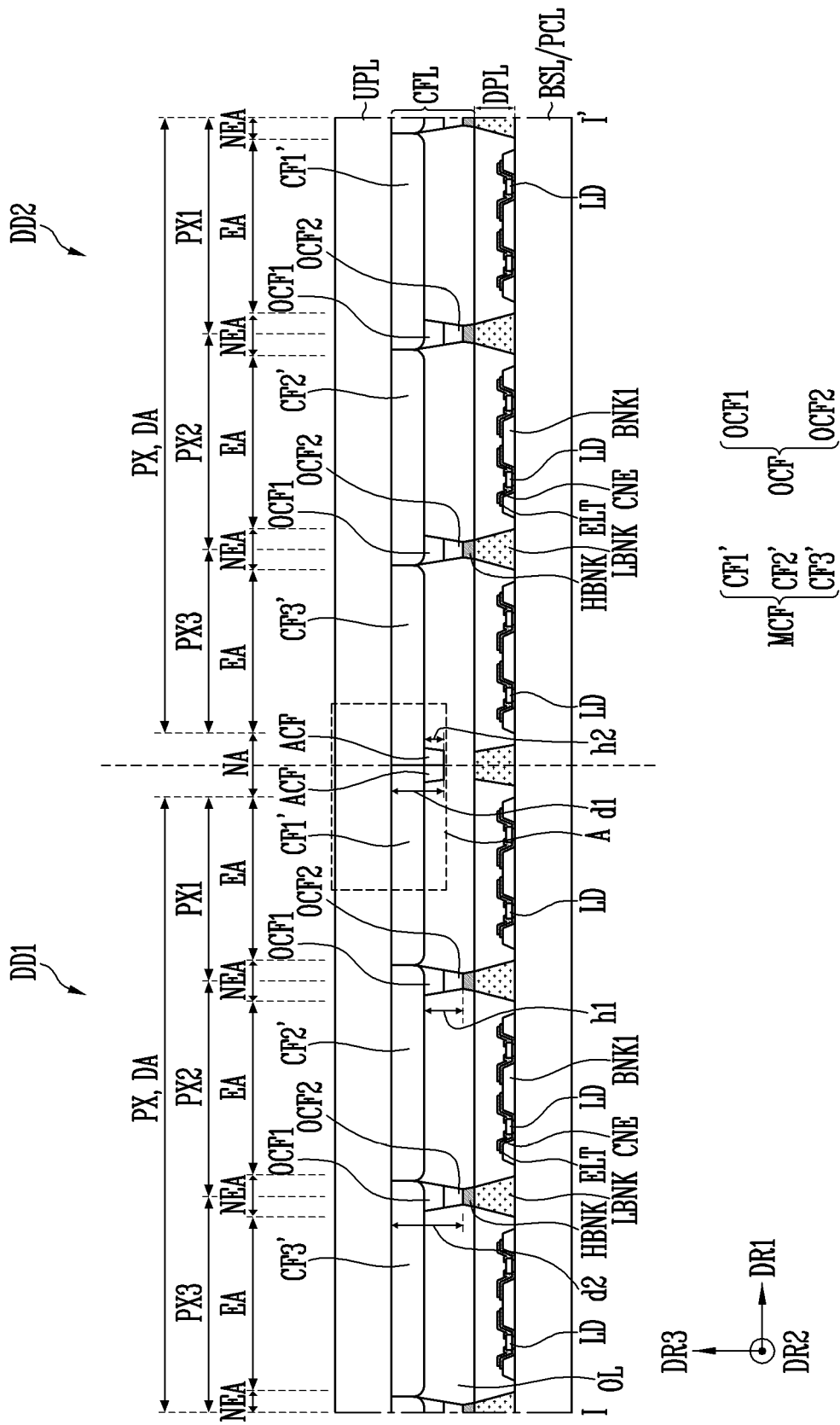
FIGS. 10-11 are each a cross sectional view of a display device in accordance with an embodiment.
Figure 11:
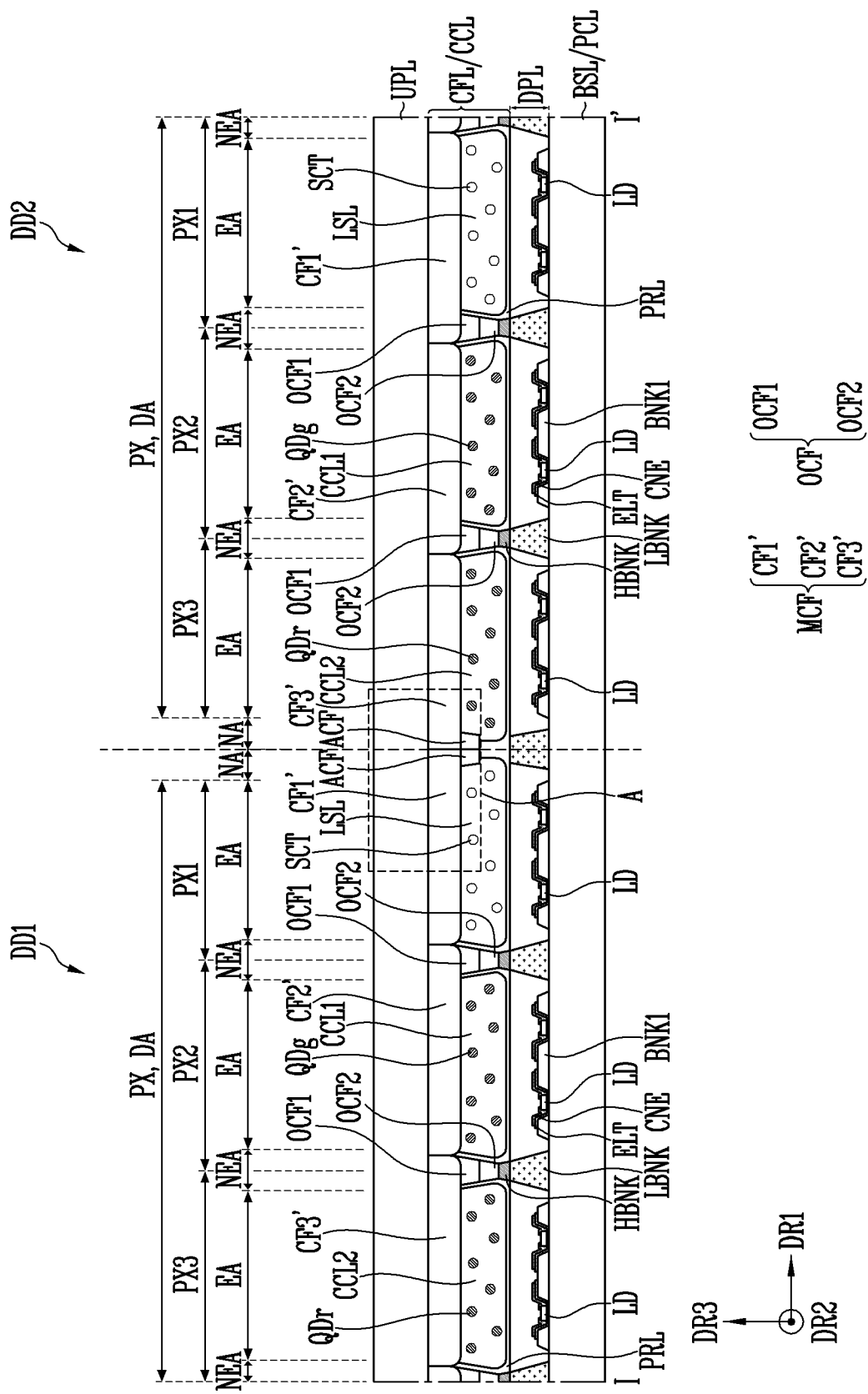
Figure 12:
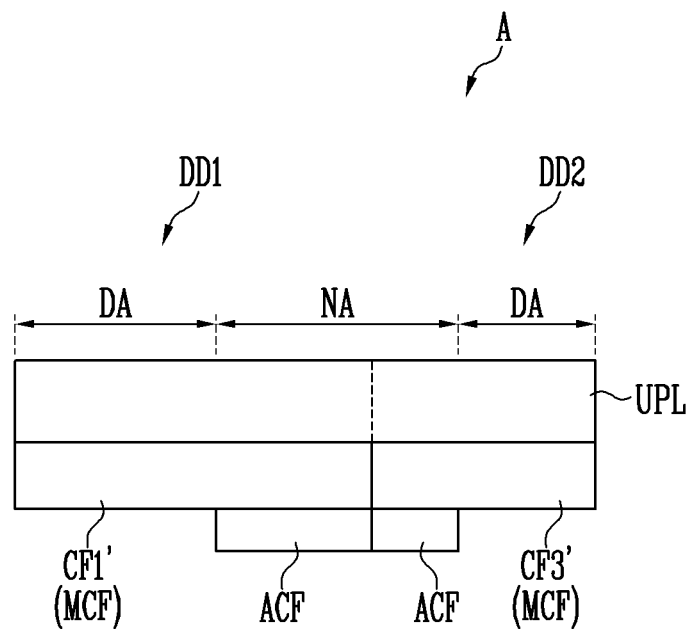
FIG. 12 is an enlarged view of area A shown in FIGS. 10 and 11.
Figure 13:
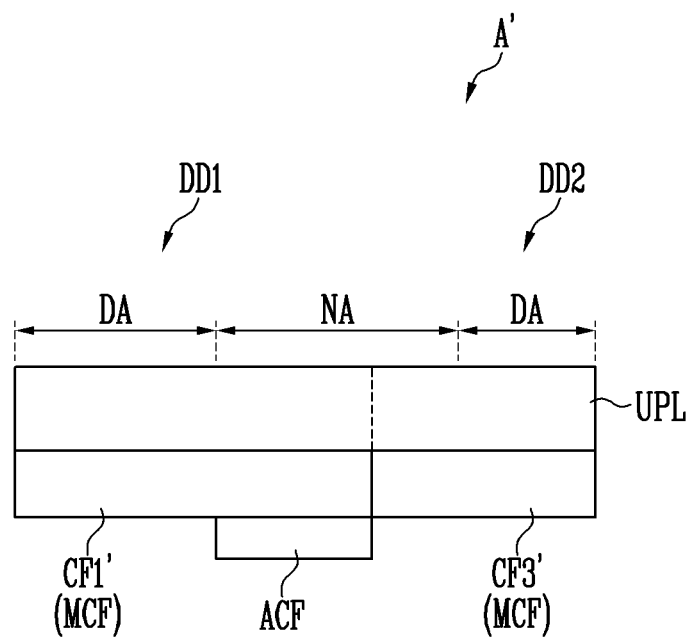
FIG. 13 is a cross sectional view illustrating a modification of the area A shown in FIG. 12.
Figure 14:
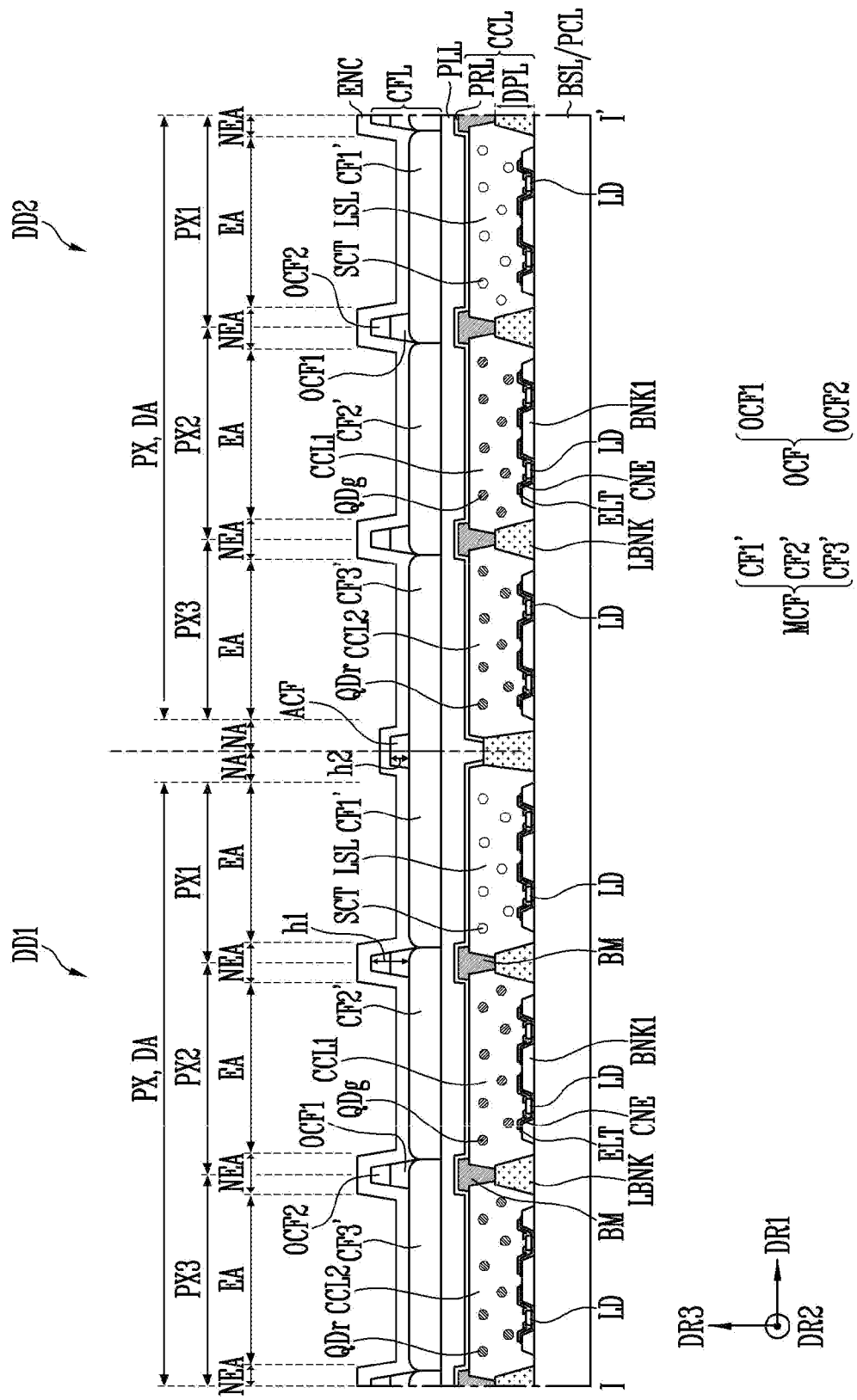
FIG. 14 is a cross sectional view of a display device in accordance with an embodiment.

FIGS. 10 and 11 are each a cross sectional views of a display device in accordance with an embodiment. FIG. 12 is an enlarged view of area A shown in FIGS. 10 and 11. FIG. 13 is a cross sectional view illustrating a modification (area A') of the area A shown in FIG. 12. FIG. 14 is a cross sectional view of a display device in accordance with an embodiment. FIGS. 10, 11, and 14 may correspond to a section taken along the line I-I' shown in FIG. 1.

In FIGS. 10, 11, and 14, a base layer BSL, a pixel circuit layer PCL, and a display element layer DPL are briefly illustrated. However, the pixel circuit layer PCL and the display element layer DPL, which are shown in FIGS. 10, 11, and 14, may correspond to the pixel circuit layer PCL and the display element layer DPL, which are shown in FIG. 3. Also, each of the display devices in accordance with the embodiments, which are shown in FIGS. 10, 11, and 14, is similar to the display device described with reference to FIGS. 5-7, and therefore, portions different from those of the display device described with reference to FIGS. 5-7 will be mainly described.

First, referring to FIG. 10, the display device in accordance with the embodiment may include a color filter layer CFL disposed on an upper substrate UPL (e.g., on a lower surface of the upper substrate UPL), which faces (e.g., overlaps) one surface (e.g., upper surface) of the base layer BSL.

The color filter layer CFL may be located on (e.g., on the upper surface of) the display element layer DPL, and may be disposed in a display area DA and a non-display area NA.

The color filter layer CFL may include a main color filter MCF disposed on the one surface (e.g., lower surface) of the upper substrate UPL, an overlapping color filter OCF overlapping with the main color filter MCF, and an auxiliary color filter ACF.

The main color filter MCF may include a first color filter CF1', a second color filter CF2', and a third color filter CF3', which respectively allow light of a first color, a second color, and a third color to be transmitted therethrough. Each of the first color, the second color, and the third color may be any one selected from among red, green, and blue.

The main color filter MCF may be disposed in an emission area EA, a non-emission area NEA, and the non-display area NA. The first color filter CF1', the second color filter CF2', and the third color filter CF3' may be disposed in the same layer. For example, when the first color filter CF1', the second color filter CF2', and the third color filter CF3' are disposed side by side in the first direction DR1, the first color filter CF1' may be located in the emission area EA and the non-display area NA, and the second color filter CF2' and the third color filter CF3' may be located in the non-emission area NEA and the emission area EA. In some embodiments, the first color filter CF1' of the first display device DD1 immediately adjacent to the non-display area NA between the first and second display devices DD1 and DD2 may be in the emission area EA and in the non-display area NA between the first and second display devices DD1 and DD2, and the second and third color filters CF2' and CF3' of the first display device DD1 may each be located in the emission area EA and the non-emission area NEA.

The overlapping color filter OCF may overlap with a portion of the main color filter MCF, and may be disposed in the non-emission area NEA. For example, the overlapping color filter OCF may overlap with a portion of the main color filter MCF located in the non-emission area NEA.

The overlapping color filter OCF includes a first overlapping color filter OCF1 and a second overlapping color filter OCF2, which respectively allow different colors to be transmitted therethrough.

The first overlapping color filter OCF1 and the second overlapping color filter OCF2 may be located on a portion of the main color filter MCF while overlapping with each other. For example, the first overlapping color filter OCF1 may be disposed on a portion (e.g., on a portion of a lower surface) of the third color filter CF3' disposed in the non-emission area NEA, and the second overlapping color filter OCF2 may be disposed on (e.g., on a lower surface of) the first overlapping color filter OCF1.

Each of the first overlapping color filter OCF1 and the second overlapping color filter OCF2 may allow light of any one selected from among the first color, the second color, and the third color to be transmitted therethrough, and the main color filter MCF overlapping with the overlapping color filter OCF may allow light of the other color (e.g., the remaining color of the first color, the second color, and the third color) of which light is not transmitted through the first overlapping color filter OCF1 and the second overlapping color filter OCF2 to be transmitted therethrough. For example, the first overlapping color filter OCF1 may be a green color filter which allows light of green (e.g., of a green color) to be selectively transmitted therethrough, the second overlapping color filter OCF2 may be a blue color filter which allows light of blue (e.g., of a blue color) to be selectively transmitted therethrough, and the main color filter MCF may be a red color filter which allows light of red (e.g., of a red color) to be selectively transmitted therethrough. Accordingly, a portion of the main color filter MCF disposed in the non-emission area NEA, the first overlapping color filter OCF1, and the second overlapping color filter OCF2 may serve as a light blocking pattern for blocking light from being transmitted therethrough.

The auxiliary color filter ACF may overlap with a portion of the main color filter MCF, and may be disposed in the non-display area NA. For example, the auxiliary color filter ACF may be located on a portion of the main color filter MCF located in the non-display area NA.

A thickness h2 of the auxiliary color filter ACF may be different from a thickness h1 of the overlapping color filter OCF. For example, the thickness h2 of the auxiliary color filter ACF may be thinner than the thickness h1 of the overlapping color filter OCF. A thickness d1 in the third direction D3, which is obtained by adding the main color filter MCF and the auxiliary color filter ACF in the non-display area NA (e.g., which is the sum of a thickness of the main color filter MCF in the non-display area NA and the thickness h2 of the auxiliary color filter ACF), may be thinner than a thickness d2 in the third direction DR3, which is obtained by adding the main color filter MCF and the overlapping color filter OCF in the non-emission area NEA (e.g., which is the sum of a thickness of the main color filter MCF in the non-emission area NEA and the thickness h1 of the overlapping color filter OCF).

Accordingly, in the non-display area NA, light transmittance can be increased, as compare with a case where the color filter CF is formed to have the same thickness in the display area DA and the non-display area NA (e.g., as compared to when the thickness h1 of the overlapping color filter OCF is the same as the thickness h2 of the auxiliary color filter ACF). For example, a stacked number of the color filter CF located in the non-display area NA is formed smaller than that of the color filter CF located in the non-emission area NEA, so that the light transmittance in the non-display area NA can be increased. In some embodiments, a number of color filters in a stack of color filters in the non-display area NA is less than a number of color filters in a stack of color filters in the non-emission area NEA.

Thus, although a plurality of display devices are disposed, the visibility of the boundary area (e.g., the seam area, the non-display area NA, etc.) between the display devices, for example, the visibility of the non-display area NA, can be weakened, and the luminance of the plurality of display devices can be increased.

The main color filter MCF overlapping with the auxiliary color filter ACF may allow light of a first color to be transmitted therethrough, and the auxiliary color filter ACF may allow light of a second color or a third color to be transmitted therethrough. For example, when the main color filter MCF (e.g., the portion of the main color filter MCF overlapping the auxiliary color filter ACF) is a red color filter, the auxiliary color filter ACF may be a blue or green color filter. Accordingly, in an embodiment, when a portion of the main color filter MCF and the auxiliary color filter ACF, which are disposed in the non-display area NA, allow light of red and blue to be transmitted therethrough, respectively, light of green may be blocked. In addition, when a portion of the main color filter MCF and the auxiliary color filter ACF, which are disposed in the non-display area NA, allow light of red and green, respectively, to be transmitted therethrough, light of blue may be blocked.

An organic layer OL may be located at a portion of the main color filter MCF disposed in the emission area EA. The organic layer OL may be located at a portion at which the overlapping color filter OCF and the auxiliary color filter ACF do not overlap with each other in the first color filter CF1', the second color filter CF2', and the third color filter CF3'. The organic layer OL may be configured as a single layer or a multi-layer, which includes at least one organic layer. In some embodiments, at least a portion of the organic layer OL may be in the emission area EA under (e.g., on a lower surface of) the first, second, and third color filters CF1', CF2', CF3'. In some embodiments, a portion of the organic layer OL may be in the non-display area NA under (e.g., on a lower surface of) the auxiliary color filter ACF. In some embodiments, the organic layer OL may cover a lower surface of the first, second, and third color filters CF1', CF2', and CF3', may be provided in plurality, and may be separated, or spaced apart, in a plan view by stacks of the upper bank HBNK, the second overlapping color filter OCF2, and the first overlapping color filter OCF1.

Referring to FIG. 11, the display device in accordance with the embodiment may include a color conversion layer CCL disposed on one surface (e.g., lower surface) of the color filter layer CFL to face (e.g., overlap) the one surface (e.g., upper surface) of the base layer BSL.

The color conversion layer CCL includes a light scattering layer LSL, a first color conversion layer CCL1, and a second color conversion layer CCL2. The color conversion layer CCL may be located between the overlapping color filters OCF and the auxiliary color filter ACF. For example, the light scattering layer LSL (e.g., the light scattering layer LSL of the first sub-pixel PX1 of the first display device DD1 closest to the non-display area NA between the first and second display devices DD1 and DD2) may be located between the auxiliary color filter ACF and the overlapping color filter OCF, and the first color conversion layer CCL1 and the second color conversion layer CCL2 may be located between the overlapping color filters OCF.

The upper bank HBNK may be located on the bottom of the overlapping color filter OCF. The upper bank HBNK may be located between the second overlapping color filter OCF2 and the lower bank LBNK to support the upper substrate and the lower substrate. In some embodiments, a pattern capable of blocking light may be additionally disposed among the light scattering layer LSL, the first color conversion layer CCL1, and the second color conversion layer CCL2.

Referring to FIG. 12, the color filter CFL of the first display device DD1 and the second display device DD2 will be described in more detail.

When side surfaces of the first display device DD1 and the second display device DD2 are located adjacent to each other, a side surface of a main color filter MCF of the first display device DD1 and a side surface of a main color filter MCF of the second display device DD2 may be located adjacent to each other. In addition, side surfaces of auxiliary color filters ACF disposed in the non-display area NA of the first and second display devices DD1 and DD2 may be located adjacent to each other.

The main color filter MCF of the first display device DD1 and the main color filter MCF of the second display device DD2 may allow light of the same color among the first color, the second color, and the third color to be transmitted therethrough in some embodiments, and may allow light of different colors to be transmitted therethrough in some embodiments. For example, in some embodiments, the main color filter MCF of the first display device DD1 may be the first color filter CF1' as a red color filter, and the main color filter MCF of the second display device DD2 may be the third color filter CF3' as a red color filter. In addition, in some embodiments, the main color filter MCF of the first display device DD1 may be the first color filter CF1' as a red color filter, and the main color filter MCF of the second display device DD2 may be the third color filter CF3' as a blue color filter.

The auxiliary color filter ACF of the first display device DD1 and the auxiliary color filter ACF of the second display device DD2 may allow light of the same color among the first color, the second color, and the third color to be transmitted therethrough in some embodiments, and may allow light of different colors to be transmitted therethrough in some embodiments. For example, in some embodiments, when the first color filter CF1' of the first display device DD1 and the third color filter CF3' of the second display device DD2 is each a red color filter, the auxiliary color filter ACF of each of the first display device DD1 and the second display device DD2 may be a blue or green color filter. In addition, in some embodiments, when the first color filter CF1' of the first display device DD1 is a red color filter and the third color filter CF3' of the second display device DD2 is a blue color filter, the auxiliary color filter ACF of the first display device DD1 may be a blue or green color filter, and the auxiliary color filter ACF of the second display device DD2 may be a red or green color filter.

Although a case where the auxiliary color filter ACF is disposed in each display device has been illustrated in accordance with the embodiment, the auxiliary color filter ACF may be disposed in only one display device among a plurality of display devices adjacent to each other. However, the present disclosure is not limited thereto. In some embodiments, the auxiliary color filter ACF is disposed on one surface of the main color filter MCF of the second display device DD2, and an auxiliary color filter ACF is not disposed on one surface of the main color filter MCF of the first display device DD1.

Referring to FIG. 13, an embodiment in which the auxiliary filter ACF is disposed in only one display device is illustrated. In some embodiments, the area A shown in FIGS. 10 and 11 may be modified into area A'.

In some embodiments, the auxiliary color filter ACF is disposed on one surface of the main color filter MCF of the first display device DD1. In some embodiments, an auxiliary color filter ACF is not disposed on one surface of the main color filter MCF of the second display device DD2.

However, as described above, the thickness d1 of the main color filter MCF and the auxiliary color filter ACF, which are disposed in the non-display area NA, may be thinner than the thickness d2 of the main color filter MCF and the overlapping color filter OCF, which are disposed in the display area DA (e.g., in the non-emission area NEA of the display area DA), and thus, the light transmittance in the non-display area NA can be increased.

Referring to FIG. 14, the display device in accordance with the present disclosure may include a color conversion layer CCL and a color filter layer CFL, which are sequentially stacked on the one surface of the base layer BSL. The color filter layer CFL may include a main color filter MCF, an overlapping color filter OCF, and an auxiliary color filter ACF. Also, the display device may further include a planarization layer PLL located between the color conversion layer CCL and the color filter layer CFL and an encapsulation layer ENC located on the color filter layer CFL.

The encapsulation layer ENC may cover surfaces of the main color filter MCF, the overlapping color filter OCF, and the auxiliary color filter ACF, thereby encapsulating the display area DA and/or the non-display area NA. For example, the encapsulation layer ENC may be located to cover top surfaces of a first color filter CF1', a second color filter CF2', and a third color filter CF3', and may be located to cover top surfaces and side surfaces (e.g., both side surfaces) of the overlapping color filter OCF and the auxiliary color filter ACF. A thickness (e.g., a thickness in the third direction DR3) of the overlapping color filter OCF may be thicker than that of the auxiliary color filter ACF, and therefore, the encapsulation layer ENC covering the surface of the overlapping color filter OCF may be located to further protrude toward an upper portion along the third direction DR3 than the encapsulating layer ENC covering the surface of the auxiliary color filter ACF.

In the display device in accordance with the embodiment, a thickness of the main color filter MCF and the auxiliary color filter ACF, which are disposed in the non-display area NA, may be thinner than that of the main color filter MCF and the auxiliary color filter ACF, which are disposed in the display area DA, and thus, the light transmittance in the non-display area NA can be increased.

Hereinafter, an improved effect of the above-described display device in accordance with the embodiment will be described with reference to FIGS. 15 and 16.

Figures 15, 16:
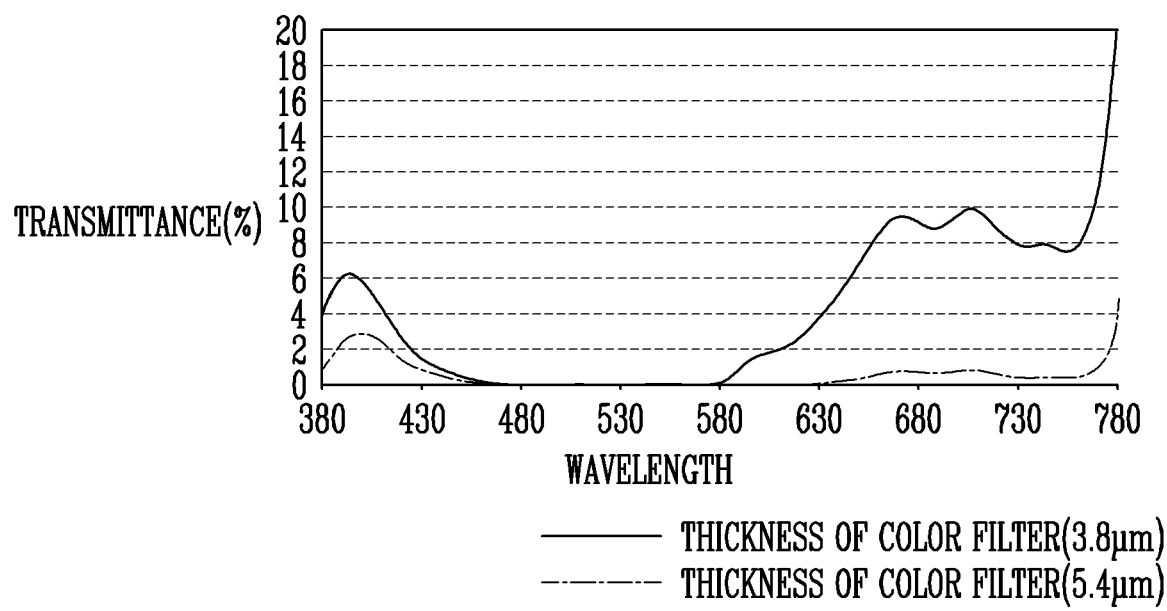
FIG. 15 is a graph illustrating transmittance according to wavelength in a display device in accordance with an embodiment.
FIG. 16 is a table illustrating optical density according to thickness of a color filter in a display device in accordance with an embodiment.

FIG. 15 is a graph illustrating transmittance according to wavelength in a display device in accordance with an embodiment. FIG. 16 is a table illustrating optical density according to thickness of a color filter in a display device in accordance with an embodiment. The graph and the table, which are shown in FIGS. 15 and 16, illustrate an improved effect of the display device in accordance with the embodiments, which are shown in FIGS. 10, 11, and 14. Hereinafter, this will be described together with reference to FIGS. 4-7.

Referring to FIG. 15, transmittance of a display device in which the thickness of a color filter is 5.4 μm is indicated by a dotted line, and transmittance of a display device in which the thickness of a color filter is 3.8 μm is indicated by a solid line. The transmittance may be transmittance measured in the non-display area NA of the display device. In the display device in which the thickness of the color filter is thin (e.g., when the thickness of the color filter is 3.8 μm), it can be seen that the transmittance is increased as the wavelength is increased in a certain range.

Referring to FIG. 16, optical density (OD) value according to thickness of the color filter is illustrated. The OD may be OD measured in the non-display area NA of the display device. It can be seen that the OD becomes lowers as the thickness of the color filter becomes thinner. That is, it can be seen that the light transmittance is increased as the thickness of the color filter becomes thinner.

The color filter having a thickness of 3.8 μm of FIGS. 15 and 16 may correspond to the main color filter MCF and the auxiliary color filter ACF, which are described above. For example, the main color filter MCF may be a red color filter, and the auxiliary color filter ACF may be a blue color filter. However, the present disclosure is not limited thereto.

In accordance with the present disclosure, a thickness of the light blocking pattern located in the non-display area is formed thinner than a thickness of the light blocking pattern located in the display area (e.g., in the non-emission area of the display area), so that the light transmittance in the non-display area can be increased.

Further, a thickness of the color filter located in the non-display area is formed thinner than a thickness of the color filter located in the non-emission area, so that the light transmittance in the non-display area can be increased. For example, a stacked number of the color filter (e.g., the number of color filters in a stack of color filters) located in the non-display area is formed smaller than a stacked number of the color filter (e.g., the number of color filters in a stack of color filters) located in the non-emission area, so that the light transmittance in the non-display area can be increased.

Further, as the transmittance in the non-display area is increased, the visibility of a seam area can be weakened, and the luminance of the display device can be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of ordinary skill in the art that various suitable changes in form and details may be made without departing from the spirit and scope of the present disclosure as set forth in the following claims and equivalents thereof.

What is claimed is:

1. A display device comprising:
a base layer comprising:
   a display area comprising:
      an emission area; and
         a non-emission area adjacent to the emission area, and
   a non-display area around the display area;
a light emitting element in the emission area and on the base layer;
a color filter layer on the light emitting element; and
a light blocking pattern on the light emitting element and comprising:
   a first light blocking pattern in the non-emission area, and
   a second light blocking pattern in the non-display area,
wherein the first light blocking pattern and the second light blocking pattern are different in thickness from each other, and
wherein the first light blocking pattern and the second light blocking pattern are in the same layer.

2. The display device of claim 1, wherein the second light blocking pattern is thinner than the first light blocking pattern in thickness.

3. The display device of claim 1, wherein the second light blocking pattern is 1 μm or less in thickness.

4. The display device of claim 1, wherein the emission area comprises a first sub-emission area, a second sub-emission area, and a third sub-emission area, which are spaced apart from each other, and
   wherein the color filter layer comprises a first color filter, a second color filter, and a third color filter, which are respectively in the first sub-emission area, the second sub-emission area, and the third sub-emission area.

5. The display device of claim 4, wherein the first light blocking pattern is between two color filters selected from among the first color filter, the second color filter, and the third color filter, or overlaps with an edge of at least one selected from among the first color filter, the second color filter, and the third color filter.

6. The display device of claim 4, wherein the second light blocking pattern is at a side surface of at least one color filter selected from among the first color filter, the second color filter, and the third color filter adjacent to the non-display area, or overlaps with at least a portion of the first light blocking pattern adjacent to the non-display area.

7. The display device of claim 4, further comprising:
a color conversion layer on one surface of the color filter layer,
wherein the color conversion layer comprises:
   a light scattering layer on one surface of the first color filter, and comprising light scattering particles;
   a first color conversion layer on one surface of the second color filter, and comprising first color conversion particles; and
   a second color conversion layer on one surface of the third color filter, and comprising second color conversion particles.

8. The display device of claim 7, further comprising:
an encapsulation layer on the color filter layer,
wherein the color filter layer is on the color conversion layer, and
wherein the encapsulation layer covers surfaces of the first color filter, the second color filter, the third color filter, the first light blocking pattern, and the second light blocking pattern.

* * * * *